United States Patent
Richards

(10) Patent No.: US 10,908,229 B2
(45) Date of Patent: Feb. 2, 2021

(54) REGULATION OF COEFFICIENTS USED IN MAGNETIC FIELD SENSOR VIRTUAL SIGNAL GENERATION

(71) Applicant: Allegro MicroSystems, LLC, Manchester, NH (US)

(72) Inventor: Zachary Richards, Epsom, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/686,419

(22) Filed: Nov. 18, 2019

(65) Prior Publication Data

US 2020/0081073 A1  Mar. 12, 2020

Related U.S. Application Data

(63) Continuation-in-part of application No. 16/290,017, filed on Mar. 1, 2019, now Pat. No. 10,598,739, which is a continuation-in-part of application No. 16/010,969, filed on Jun. 18, 2018, now Pat. No. 10,578,679.

(51) Int. Cl.
  *G01R 33/00* (2006.01)
  *G06F 17/17* (2006.01)

(52) U.S. Cl.
  CPC ......... *G01R 33/0017* (2013.01); *G06F 17/17* (2013.01)

(58) Field of Classification Search
  CPC .. G01R 31/311; G01R 31/2656; G01R 1/071; G01R 31/2635; G01R 31/31728; H01L 21/681; H01L 31/0232
  USPC ....... 324/97, 750.23, 750.27, 754.21–754.31
  See application file for complete search history.

(56) References Cited

U.S. PATENT DOCUMENTS

| | | |
|---|---|---|
| 4,322,682 A | 3/1982 | Shadwill |
| 5,329,692 A | 7/1994 | Kashiwagi |
| 5,430,292 A | 7/1995 | Honjo et al. |
| 5,506,510 A | 4/1996 | Blumenau |

(Continued)

OTHER PUBLICATIONS

Allegro MicroSystems, LLC Datasheet; "ATS605LSG; Dual Output Differential Speed and Direction Sensor IC;" Rev.2; Jun. 15, 2017; 17 pages.

(Continued)

*Primary Examiner* — Giovanni Astacio-Oquendo
(74) *Attorney, Agent, or Firm* — Daly, Crowley, Mofford & Durkee, LLP

(57) ABSTRACT

A magnetic field sensor includes a plurality of magnetic field sensing elements configured to generate at least two measured magnetic field signals indicative of a magnetic field affected by an object and having a first predetermined phase difference with respect to each other. A controller responsive to the measured magnetic field signals is configured to generate at least one virtual magnetic field signal having a second predetermined phase difference with respect to at least one of the measured magnetic field signals. The controller is configured to calculate a virtual tangent of the virtual magnetic field signal and at least one measured magnetic field signal and compute a second derivative of an arctangent extraction of the virtual tangent. Coefficients used to generate the virtual magnetic field signals are regulated in a feedback system in order to achieve a desired phase difference between a reference and a virtual magnetic field signal.

20 Claims, 26 Drawing Sheets

(56) References Cited

U.S. PATENT DOCUMENTS

| | | | |
|---|---|---|---|
| 7,129,734 B2* | 10/2006 | Geiger | G01R 31/3167 |
| | | | 324/750.3 |
| 7,219,563 B2* | 5/2007 | Saito | G01D 3/0365 |
| | | | 73/862.331 |
| 9,007,054 B2 | 4/2015 | Friedrich et al. | |
| 9,182,456 B2 | 11/2015 | Shoemaker et al. | |
| 9,417,295 B2 | 8/2016 | Friedrich et al. | |
| 10,481,220 B2 | 11/2019 | Alpago et al. | |
| 10,495,485 B2 | 12/2019 | Burdette et al. | |
| 10,578,679 B2 | 3/2020 | Sitorus et al. | |
| 10,598,739 B2 | 3/2020 | Shoemaker et al. | |
| 2006/0076503 A1 | 4/2006 | Tsao | |
| 2006/0273263 A1 | 12/2006 | Raymond et al. | |
| 2014/0139218 A1 | 5/2014 | Findeklee et al. | |
| 2014/0210472 A1 | 7/2014 | Homann et al. | |
| 2014/0210475 A1 | 7/2014 | Li et al. | |
| 2014/0253122 A1 | 9/2014 | Leussler et al. | |
| 2016/0047858 A1* | 2/2016 | Goh | G01R 31/311 |
| | | | 324/754.23 |
| 2016/0061883 A1* | 3/2016 | Engberg | G01J 1/08 |
| | | | 324/754.23 |
| 2016/0377669 A1* | 12/2016 | Manipatruni | G01R 31/2879 |
| | | | 324/613 |
| 2017/0219662 A1 | 8/2017 | Prentice et al. | |
| 2017/0336225 A1 | 11/2017 | Burdette et al. | |
| 2020/0080867 A1* | 3/2020 | Foletto | G01D 5/16 |

OTHER PUBLICATIONS

Office Action dated Oct. 11, 2019 for U.S. Appl. No. 16/010,969; 8 pages.

Terminal Disclaimer dated Dec. 10, 2019 for U.S. Appl. No. 16/010,969; 2 pages.

Response to Office Action dated Dec. 11, 2019 for U.S. Appl. No. 16/010,969; 7 pages.

Notice of Allowance dated Jan. 8, 2020 for U.S. Appl. No. 16/010,969; 10 pages.

Office Action dated Oct. 11, 2019 for U.S. Appl. No. 16/290,017; 8 pages.

Terminal Disclaimer dated Dec. 10, 2019 for U.S. Appl. No. 16/290,017; 2 pages.

Response to Office Action dated Dec. 11, 2019 for U.S. Appl. No. 16/290,017; 11 pages.

Notice of Allowance dated Jan. 15, 2020 for U.S. Appl. No. 16/290,017; 10 pages.

Response to Office Action filed on Oct. 19, 2020 for U.S. Appl. No. 16/686,439; 9 pages.

Office Action dated Sep. 18, 2020 for U.S. Appl. No. 16/686,439; 9 pages.

Notice of Allowance dated Nov. 2, 2020 for U.S. Appl. No. 16/686,439, 10 pages.

* cited by examiner

REGULATION OF COEFFICIENTS USED IN MAGNETIC FIELD SENSOR VIRTUAL SIGNAL GENERATION

CROSS-REFERENCE TO RELATED APPLICATIONS

This application is a Continuation-in-Part (CIP) application of and claims the benefit of and priority to U.S. patent application Ser. No. 16/290,017, filed on Mar. 1, 2019, which application is incorporated by reference herein in its entirety and which is a Continuation-in-Part (CIP) application of and claims the benefit of and priority to U.S. patent application Ser. No. 16/010,969, filed on Jun. 18, 2018, which application is incorporated by reference herein in its entirety.

STATEMENT REGARDING FEDERALLY SPONSORED RESEARCH

Not Applicable.

FIELD

This disclosure relates generally to magnetic field sensors and more particularly, to magnetic field sensors having virtual magnetic field signals for providing high resolution outputs.

BACKGROUND

As is known, sensors are used in various types of devices to measure and monitor properties of systems in a wide variety of applications. For example, sensors have become common in products that rely on electronics in their operation, such as automotive and motor control systems.

Some sensors monitor properties by detecting a magnetic field associated with proximity or movement of a target object with respect to one or more magnetic field sensing elements. In magnetic field sensors including multiple magnetic field sensing elements, magnetic field signals from the sensing elements can be processed by separate processing channels to generate respective phase separated signals. One such magnetic field sensor is the Allegro MicroSystems, LLC ATS605LSG Dual Output Differential Speed and Direction Sensor IC, in which the output signal from each of the two processing channels is provided at a respective output pin of the sensor integrated circuit (IC). The channel output, or speed signals can be provided in the form of two-state binary signals having a frequency indicative of the speed of rotation of the target object. Additional output signals can include a direction signal indicative of a direction of rotation of a target object and/or an exclusive OR (XOR) speed signal that provides a signal resulting from an XOR logic operation based on the speed signals.

There are applications for which it is desirable that a magnetic field sensor provide a higher resolution of angular detection of the target object than can be accomplished with two speed signals or the XOR speed signal, for example to permit tighter control and better reactivity to change in position. While angular resolution can be increased by using additional sensors in different physical locations and/or by using more complex targets, these solutions can require more physical size for the sensor installation, higher costs for more sensing components, and/or more manufacturing complexity.

SUMMARY

According to the disclosure, a magnetic field sensor includes a plurality of magnetic field sensing elements configured to generate at least two measured magnetic field signals indicative of a magnetic field affected by an object and having a first phase difference $\phi_p$ with respect to each other and a controller responsive to the at least two measured magnetic field signals and configured to generate at least one virtual magnetic field signal having a second predetermined phase difference $\phi_i$ with respect to at least one of the measured magnetic field signals, wherein the at least one virtual magnetic field signal is generated according to a mathematical function based on a first coefficient corresponding to a first channel, the first coefficient based on the first phase difference and the second predetermined phase difference, and a second coefficient corresponding to a second channel, the second coefficient based on the first phase difference and the second predetermined phase difference.

Features may include one or more of the following individually or in combination with other features. The controller may be further configured to calculate a virtual tangent including a tangent of the virtual magnetic field signal and at least one of the measured magnetic field signals, calculate an arctangent extraction including an arctangent of the virtual tangent, and calculate a second derivative of the arctangent extraction. The controller may be further configured to select initial values for the first and second coefficients used to calculate the virtual tangent and determine if a slope of the second derivative of the arctangent extraction is equal to approximately zero. The controller may be configured to adjust one or both of the initial values for the first and second coefficients until the second derivative of the arctangent extraction is equal to approximately zero. The controller may be further configured to assume an initial predetermined value for the first phase difference, calculate the first and second coefficients, and determine if a slope of the second derivative of the arctangent extraction is equal to approximately zero. When the slope of the second derivative is not equal to zero, the controller may be configured to adjust the initial predetermined value for the first phase difference to provide an adjusted first phase difference, calculate the second derivative of the arctangent extraction using the adjusted first phase difference, and determine if the slope of the second derivative of the arctangent extraction is equal to approximately zero. The adjusted first phase difference may be indicative of the second predetermined phase difference when the slope of the second derivative of the arctangent extraction is equal to approximately zero. The second predetermined phase difference may be 90-degrees.

Also described is a method including generating at least two measured magnetic field signals indicative of a magnetic field affected by an object, wherein the at least two measured magnetic field signals have a first phase difference $\phi_p$ with respect to each other and processing the at least two measured magnetic field signals to generate at least one first virtual magnetic field signal having a second predetermined phase difference $\phi_i$ with respect to at least one of the at least two measured magnetic field signals, wherein the at least one virtual magnetic field signal is generated according to a mathematical function based on a first coefficient corresponding to a first channel, the first coefficient based on the first phase difference and the second phase difference, and a second coefficient corresponding to a second channel, the second coefficient based on the first phase difference and the second predetermined phase difference.

Features may include one or more of the following individually or in combination with other features. The method may further include calculating a second derivative of an arctangent extraction of a virtual tangent of the virtual magnetic field signal and at least one of the magnetic field signals. Computing the second derivative may include selecting initial coefficients used to calculate the virtual tangent, calculating the second derivative using the initial coefficients, and determining if a slope of the second derivative is equal to zero. When the slope of the second derivative is not zero, the method may further include adjusting at least one of the initial coefficients to generate adjusted coefficients, calculating the second derivative of the arctangent extraction using the adjusted coefficients, and determining if the slope of the second derivative is equal to zero, wherein the adjusted coefficients are correct when the slope of the second derivative is equal to zero. Computing the second derivative may include assuming an initial predetermined value for the first phase difference between the at least two measured magnetic field signals, calculating the coefficients using the initial predetermined value, and calculating the second derivative of an arctangent extraction of the virtual tangent using the initial predetermined value for the phase difference. The method may further include determining if a slope of the second derivative is equal to zero and, when the slope of the second derivative is not equal to zero, adjusting the value for the first phase difference to an adjusted phase value, calculating the coefficients, and computing the second derivative using the adjusted phase value. The method may further include determining if the slope of the second derivative is equal to zero, wherein the adjusted phase value is correct when the slope of the second derivative is equal to zero.

Also described is apparatus including means for generating at least two measured magnetic field signals indicative of a magnetic field affected by an object, wherein the at least two measured magnetic field signals have a first phase difference with respect to each other and means for processing the at least two measured magnetic field signals to generate at least one first virtual magnetic field signal having a second predetermined phase difference with respect to at least one of the at least two measured magnetic field signals, wherein the at least one virtual magnetic field signal is generated according to a mathematical function based on a first coefficient corresponding to a first channel, the first coefficient based on the first phase difference and the second phase difference, and a second coefficient corresponding to a second channel, the second coefficient based on the first phase difference and the second predetermined phase difference.

Features may include one or more of the following individually or in combination with other features. The apparatus may further include means for computing a second derivative of an arctangent extraction of a virtual tangent of the virtual magnetic field signal and at least one of the magnetic field signals. The means for computing the second derivative may include means for selecting initial coefficients used to calculate the virtual tangent, means for calculating the second derivative using the initial coefficients, and means for determining if a slope of the second derivative is equal to zero. The means for computing the second derivative may include means for assuming an initial predetermined value for the first phase difference between the at least two measured magnetic field signals, means for calculating the coefficients using the initial predetermined value, and means for computing the second derivative of an arctangent extraction of the virtual tangent using the initial predetermined value for the phase difference. When the slope of the second derivative is not equal to zero, the apparatus may further include means for adjusting the value for the first phase difference to an adjusted phase value, means for calculating the coefficients, and means for calculating the second derivative using the adjusted phase value.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
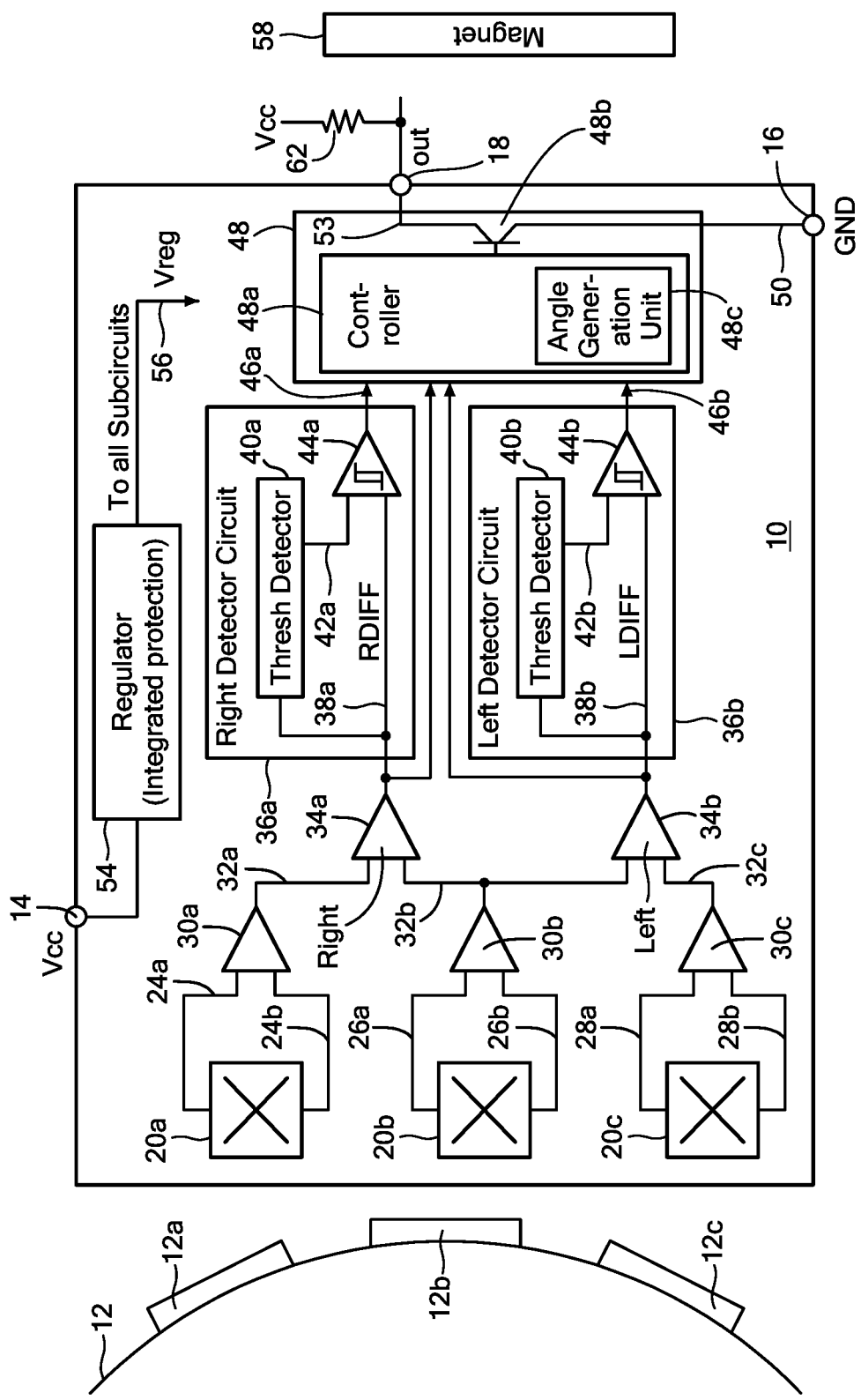
FIG. 1 shows a voltage-level output magnetic field sensor according to the disclosure.

Before describing the present disclosure, some introductory concepts and terminology are explained. As used herein, the term "rotation detector" is used to describe a circuit that includes at least one "magnetic field sensing element" which detects a magnetic field. The rotation detector can sense movement, e.g., rotation, of a ferromagnetic object, for example, advance and retreat of magnetic domains of a ring magnet or advance and retreat of gear teeth of a ferromagnetic gear. Similarly, the term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Ferromagnetic objects described herein can have a variety of forms, including, but not limited to a ring magnet having one or more pole pair or a gear having two or more gear teeth. Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects that move linearly are possible.

Referring to FIG. 1, a magnetic field sensor 10 as may take the form of a rotation detector can be used, for example, to detect passing gear teeth, for example, gear teeth 12a-12c of a ferromagnetic gear or, more generally target object 12. A permanent magnet 58 can be placed at a variety of positions proximate to the gear 12, resulting in fluctuations of a magnetic field proximate to the gear as the gear rotates. Use of the magnet 58 results in a so-called "back-bias" arrangement.

The sensor 10 can have a first terminal 14 coupled to a power supply denoted as Vcc and a second terminal 16 coupled to a fixed voltage, for example, a ground voltage, denoted as GND. A third terminal 18 of the sensor 10 permits communication of a sensor output signal 53 to circuits and systems external to the sensor. The sensor output signal 53 can be provided in the form of a voltage signal (as shown in FIG. 1) or a current signal. The illustrated sensor 10 can be considered a three terminal device (i.e., a three-wire device) since it has third terminal 18 at which output signal 53 is provided. Sensor 10 can be provided in the form of an integrated circuit (IC), with terminals 14, 16, 18 provided by pins or leads of the IC.

The sensor 10 can include first, second, and third magnetic field sensing elements 20a, 20b, 20c, respectively, here shown to be Hall effect elements. The first Hall effect element 20a generates a first differential voltage signal 24a, 24b, the second Hall effect element 20b generates a second differential voltage signal 26a, 26b, and the third Hall effect element 20c generates a third differential voltage signal 28a, 28b, each having respective AC signal components in response to the rotating target 12.

While each one of the Hall effect elements 20a, 20b, 20c is shown to be a two terminal device, one of ordinary skill in the art will understand that each of the Hall effect elements 20a, 20b, 20c is actually a four terminal device and the other two terminals of the Hall effect elements can be coupled to receive and pass respective currents as might be provided, for example, by a current source or by a voltage source (not shown).

First differential voltage signal 24a, 24b can be received by a first differential preamplifier 30a, the second differential voltage signal 26a, 26b can be received by a second differential preamplifier 30b, and the third differential voltage signal 28a, 28b can be received by a third differential preamplifier 30c. First and second amplified signals 32a, 32b generated by the first and second differential preamplifiers 30a, 30b, respectively, are received by a "right" channel amplifier 34a and the second amplified signal 32b and a third amplified signal 32c generated by the second and third differential preamplifiers 30b, 30c, respectively, are received by a "left" channel amplifier 34b. Designations of "right" and "left" are arbitrary.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature and further coupled to a controller 48a. Signals 38a, 38b are referred to herein generally as measured magnetic field signals, which signals are indicative of a magnetic field affected by the target object 12, such as by movement (e.g., rotation) of the target 12. Thus, the sensor 10 can be considered to include a right processing channel (or simply right channel) including amplifier 34a and right detector circuit 36a and a left processing channel (or simply left channel) including amplifier 34b and detector circuit 36b.

It will be appreciated that a "channel" refers generally to processing circuitry associated with one or more magnetic field sensing elements and configured to generate a respective channel signal. While the particular processing circuitry shown in FIG. 1 to provide the right channel circuitry includes right channel amplifier 34a and right channel detector circuit 36a (and similarly the processing circuitry shown in FIG. 1 to provide the left channel circuitry includes left channel amplifier 34b and left channel detector circuit 36b), such channels can include less, more, or different processing circuitry.

Since the magnetic field sensing elements 20a, 20b that contribute to the magnetic field signal 38a are physically spaced from the magnetic field sensing elements 20b, 20c that contribute to the magnetic field signal 38b, it should be appreciated that the measured magnetic field signals 38a, 38b are separated in phase. The phase difference, or separation between magnetic field signals 38a, 38b can be based on the target feature size and the spacing between the magnetic field sensing elements 20a-20c. In embodiments, the phase separation between signals 38a, 38b can be approximately ninety degrees (i.e., the signals can be approximately in a quadrature relationship). However, it will be appreciated that other phase relationships between the magnetic field signals are possible.

Furthermore, as will be explained below, while the physical separation of sensing elements 20a-20c and their differential coupling to generate the measured magnetic field signals 38a, 38b illustrates one way to generate phase separated measured magnetic field signals, other configurations and techniques are also possible as shown for example in FIG. 1A and FIG. 1B. By way of non-limiting examples, channels can be based on (i.e., can process) signals from independent (i.e., not differentially combined) magnetic field sensing elements and the phase separation of the resulting measured magnetic field signals can be achieved by the angular difference of the element positions and/or by the use of different sensing element types having axes of maximum sensitivity in different planes (e.g., see FIG. 1A). In some embodiments, some channels can be based on signals from independent magnetic field sensing elements and other channels can be based on differentially combined signals from a plurality of magnetic field sensing elements (e.g., FIG. 1B). Additional magnetic field sensing element configurations can be found in a co-pending U.S. patent application Ser. No. 15/596,514 entitled "Magnetic Field Sensors and Output Signal Formats for a Magnetic Field Sensor" filed on May 6, 2017 assigned to the Assignee of the subject application and incorporated by reference herein in its entirety.

According to the disclosure, one or more virtual magnetic field signals are generated in response to the measured magnetic field signals 38a, 38b. Virtual magnetic field signal is used herein to describe a signal that is indicative of a magnetic field affected by a target object, but which signal is computationally generated based on plurality of phase separated measured magnetic field signals which phase separated measured magnetic field signals are generated by one or more respective magnetic field sensing elements.

Taking the right channel detector circuit 36a as representative of both of the detector circuits 36a, 36b, the right channel detector circuit 36a includes a threshold detector circuit 40a coupled to receive the signal 38a. The threshold detector circuit 40a is configured to detect positive and negative peaks of the signal 38a, to identify a peak-to-peak value of the signal 38a, and to generate a threshold signal 42a that, for example, takes on a first threshold value at forty percent of the peak-to-peak value of the signal 38a and a second threshold value at sixty percent of the peak-to-peak value of the signal 38a. A comparator 44a is coupled to receive the threshold signal 42a and is also coupled to receive the signal 38a. As a result, the comparator 44a generates a binary, two-state, signal 46a that has transitions when the signal 38a crosses the first and second thresholds.

A signal 46b generated by the left channel detector circuit 36b is generated in the same way as the signal 46a. However, since the magnetic field sensing elements 20a, 20b contribute to the signal 46a, while the magnetic field sensing elements 20b, 20c contribute to the signal 46b, it should be appreciated that the signals 46a, 46b have edges that differ in time (which is equivalent to phase for a particular signal frequency, i.e., particular rotation speed). Thus, the detector circuits 36a, 36b are configured to generate respective phase separated channel output, or speed signals 46a, 46b.

As will be explained, sensor 10 can generate additional channel output signals based on the one or more virtual magnetic field signals, as may be referred to herein as virtual channel output signals (see FIGS. 2 and 4 for example). These additional, virtual channel output signals can be generated in a similar fashion to channel output signals 46a, 46b, generally by comparison of virtual magnetic field signals to one or more thresholds.

Movement speed of the target 12 can be detected in accordance with the frequency of either of the phase separated channel signals 46a, 46b. In this way channel signals 46a, 46b can be considered to contain redundant target speed information. It should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

While the sensor 10 is shown to include the detector circuits 36a, 36b, each having a particular topology, described above as peak-to-peak percentage detectors (threshold detectors), it should be understood that any form of detectors may be used, such as peak-referenced detectors (peak detectors).

An output module 48 can include controller 48a to receive and process the phase separated measured magnetic field signals 38a, 38b and generate one or more virtual magnetic field signals based on the measured magnetic field signals, as will be explained. Additionally, controller 48a can generate one or more virtual channel output signals based on respective virtual magnetic field signals. The controller 48a is further configured to generate sensor output signal 53 in a desired format, which output signal 53 may represent more than one signal. For example, output signal 53 may include one or more of channel output signals as two-state binary signals having a frequency indicative of the speed of rotation of the target object, a direction signal indicative of a direction of rotation of a target object and/or an exclusive OR (XOR) speed signal that provides a signal resulting from an XOR logic operation based on the channel output signals. The channel output signals provided at the output of the sensor may include channel output signals 46a, 46b and additional channel output signals generated based on respective virtual magnetic field signals as will be explained. The controller 48a can include an angle generation unit 48c. The angle generation unit 48c is configured to generate an angle signal from the first and second magnetic field signals 38a, 38b or 46a, 46b. These signals 38a, 38b or 46a, 46b may be referred to as "measured magnetic field signals" herein.

The angle generation unit 48c is configured to generate an angle signal from the first and second magnetic field signals generated by the first and second magnetic field sensing elements, or by a magnetic field signal (as may be generated by the first magnetic field sensing element) and a virtual signal (as may be generated from the second magnetic field signal generated by the second magnetic field sensing element). This can be accomplished, for example, by calculating the arctangent of the magnetic field signals or by using a look-up table using values to determine the corresponding angle of the object.

In the illustrated three wire sensor 10, the output driver 48b may take the form of an open-drain output. In this configuration, the driver 48b may include a bipolar transistor having a drain terminal coupled to Vcc through a pull up resistor 62, as shown.

Figure 1A:
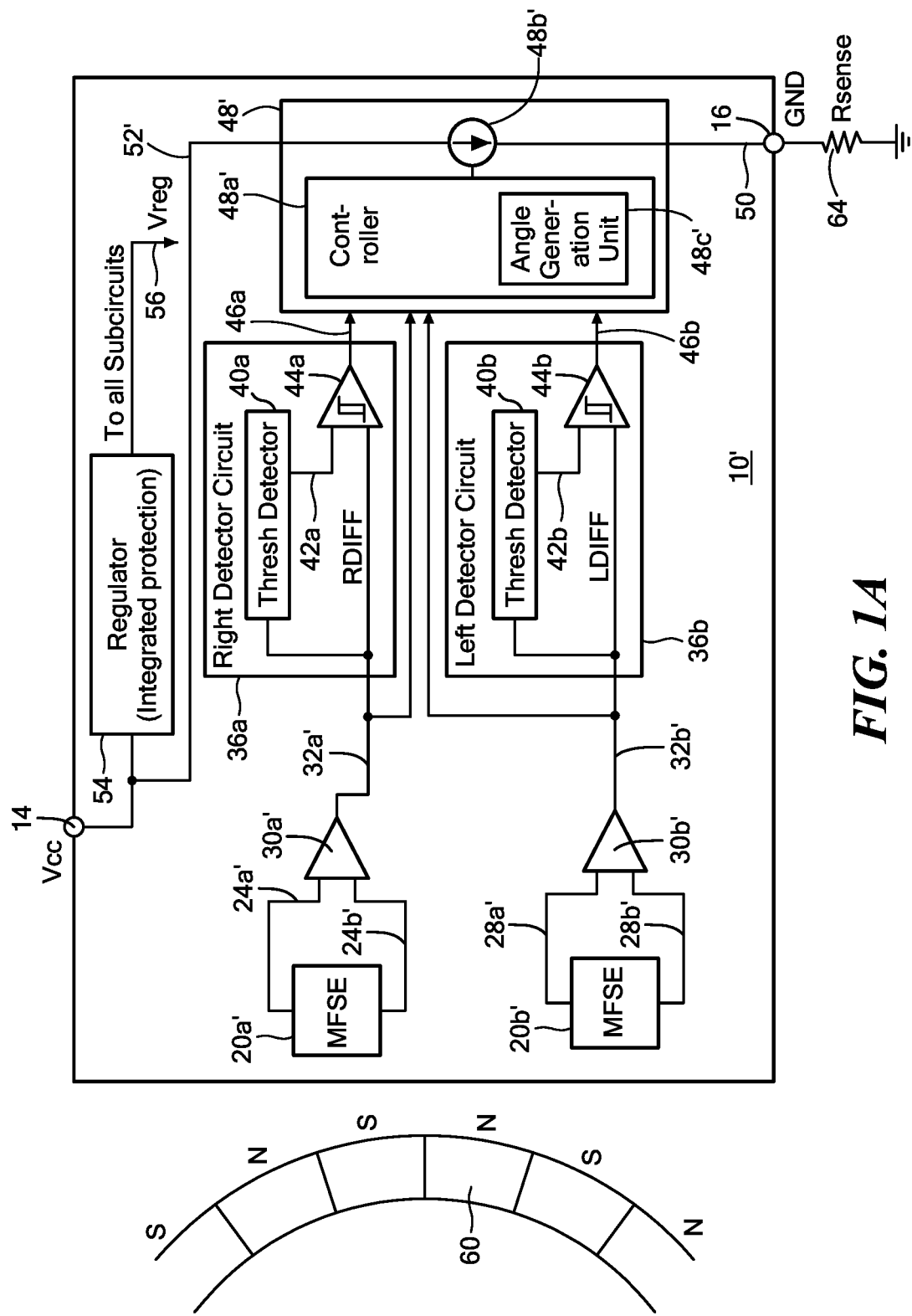
FIG. 1A shows a current-level output magnetic field sensor according to the disclosure.

Referring also to FIG. 1A, an alternative magnetic field sensor 10' as may take the form of a rotation detector can be used to detect rotation of a ring magnet 60 having at least one north pole and at least one south pole. Thus, the sensor 10' differs from the sensor 10 of FIG. 1 in that the magnet 58 is omitted and gear 12 is replaced by ring magnet 60.

The sensor 10' further differs from the sensor 10 of FIG. 1 in that sensor 10' is a so-called two terminal device (or two-wire device), for which an output signal 52' is provided in the form of a current at the two terminal power connection, superimposed upon the power supply voltage, Vcc, which current may be detected across a sense resistor 64. To this end, an output module 48' can include a controller 48a' and an output driver 48b', as may take the form of voltage-controlled current source. Various circuitry is possible to implement the voltage controlled current source 48b' such as an operational amplifier controlling current through a pass element such as bipolar transistor. While the sense resistor 64 is shown coupled to the GND terminal 16, the sense resistor may alternatively be coupled to the Vcc terminal 14. In embodiments in which the sensor 10' is provided in the form of an integrated circuit (IC), terminals 14, 16, are provided by pins or leads of the IC.

The sensor 10' further differs from the sensor 10 of FIG. 1 in that sensor 10' illustrates the use of independent, physically spaced apart magnetic field sensing elements 20a', 20b'. In embodiments, magnetic field sensing elements 20a', 20b' may take the form of magnetoresistance elements or other types of magnetic field sensing elements including Hall effect elements. For example, sensing elements 20a', 20b' may each take the form of a bridge configuration containing a plurality of magnetoresistance elements, with each such bridge physically spaced from the other. Alternatively, sensing elements 20a', 20b' may each take the form of a different sensing element type, each having an axis of maximum sensitivity in a plane that is orthogonal with respect to the plane in which the axis of maximum sensitivity of the other element lies as illustrated in FIG. 1B. With this type of arrangement, the phase separation of the resulting measured magnetic field signals can be achieved by the angular difference of the element positions and need not rely on the physical separation between the elements.

Each element 20a', 20b' can provide a respective differential signal 24a', 24b', 28a', 28b' to a respective amplifier 30a', 30b' as shown. Amplifiers 30a', 30b' in turn can provide respective measured magnetic field signals 32a', 32b' to right and left detector circuits 36a, 36b and to controller 48a', as shown. Measured magnetic field signals 32a', 32b' may thus, be similar to phase separated measured magnetic field signals 38a, 38b of FIG. 1 and thus, may be used by controller 48a' to generate one or more virtual magnetic field signals. The controller 48a' can include an angle generation unit 48c' which may be similar to angle generation unit 48c in FIG. 1. The angle generation unit 48c' is configured to generate an angle signal from the first and second magnetic field signals 38a', 38b' or 46a', 46b'.

Figure 1B:
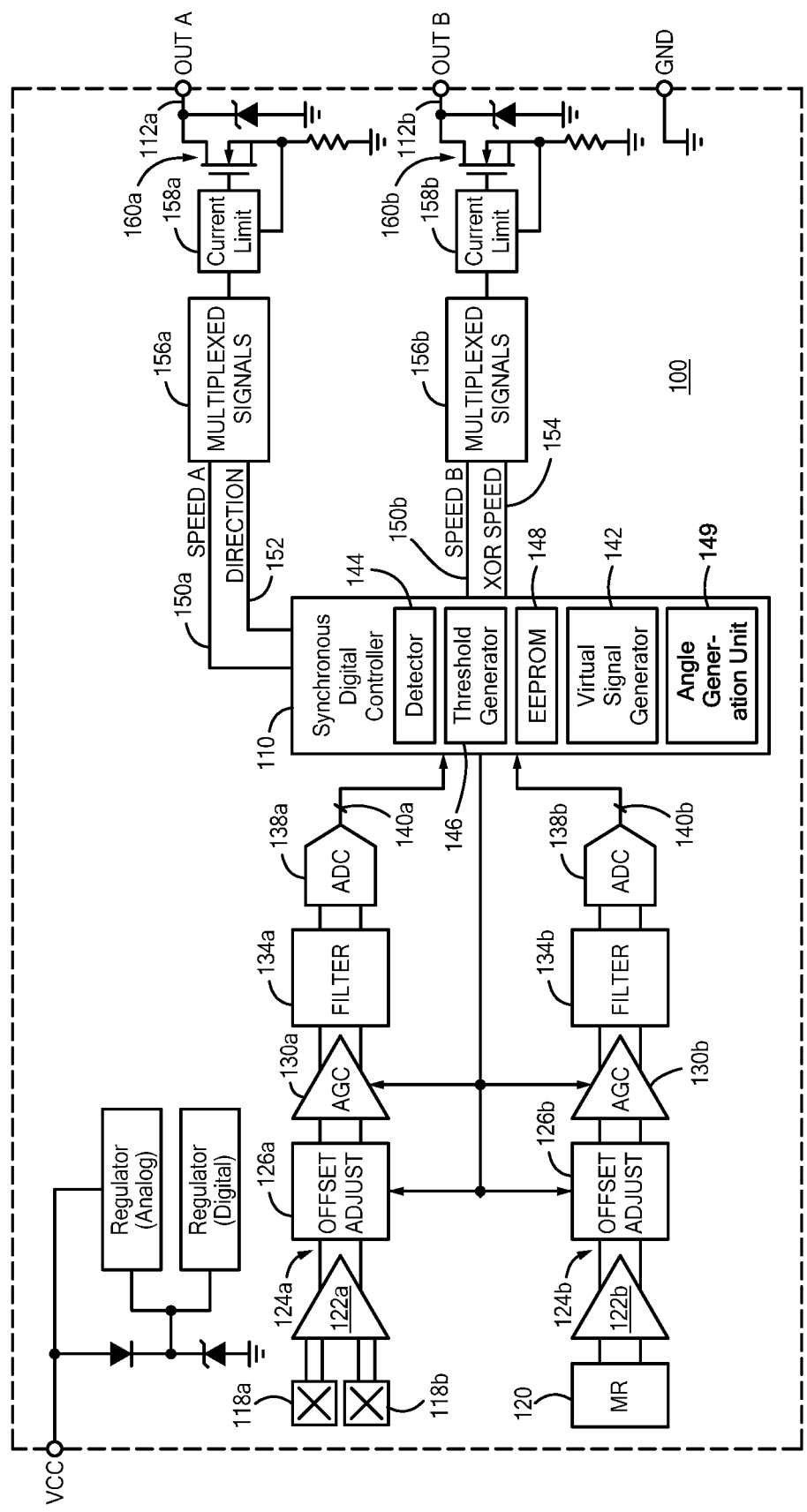
FIG. 1B shows an alternative voltage-level output magnetic field sensor according to the disclosure.

Referring also to FIG. 1B, an alternative magnetic field sensor 100 includes a digital controller 110. Sensor 100 can take the form of a rotation detector to detect rotation of a target (e.g., gear 12 of FIG. 1 or ring magnet 60 of FIG. 1A) and provide one or more output signals 112a, 112b containing speed, direction, vibration, or other target information.

Sensor 100 illustrates a magnetic field sensing element configuration including one or more first sensing elements 118a, 118b each having an axis of maximum sensitivity in a first plane and one or more second sensing elements 120 having an axis of maximum sensitivity in a second plane generally orthogonal with respect to the first plane. As one example, as illustrated, the first sensing elements 118a, 118b may be planar Hall effect elements and the second sensing element 120 may take the form of one or more magnetoresistance elements. Outputs of sensing elements 118a, 118b can be differentially combined by amplifier 122a and outputs of sensing element 120 can be provided to amplifier 122b to generate respective measured magnetic field signals 124a, 124b. With this type of arrangement, the phase separation of the resulting measured magnetic field signals 124a, 124b can be achieved by use of the different types of sensing elements having axes of maximum sensitivity in different planes and need not rely on the physical separation between the elements.

Processing of the measured magnetic field signals 124a, 124b can include offset adjustment by modules 126a, 126b, automatic gain control by elements 130a, 130b, filtering by filters 134a, 134b, and analog-to-digital conversion by ADCs 138a, 138b. The resulting measured magnetic field signals 140a, 140b thus processed are coupled to digital controller 110 as shown.

Digital controller 110 is configured to generate one or more virtual magnetic field signals based on the measured magnetic field signals 140a, 140b. To this end, controller 110 can include a virtual signal generator 142, the operation of which will be described further below. Controller 110 can be further configured to generate one or more channel output signals 150a, 150b that may be the same as or similar to channel output signals 46a, 46b of FIG. 1. To this end, controller 110 can include a detector 144 that may provide functionality similar to or the same as detectors 36a, 36b of FIG. 1 and a threshold generator 146 that may provide functionality similar to or the same as threshold detectors 40a, 40b of FIG. 1. Memory 148, such as EEPROM, can be used to store values for use by the virtual signal generator 142 and the detector 144 for example. The controller 110 can include an angle generation unit 149 which may be similar to angle generation unit 48c in FIG. 1 or 48c' in FIG. 1A. The angle generation unit 149 is configured to generate an angle signal from the magnetic field signals 140a, 140b. The magnetic field signals 140a, 140b may be referred to as "measured magnetic field signals" herein.

One or more output signals of controller 110 can include channel output signals 150a, 150b that may be the same as or similar to channel output signals 46a, 46b (FIG. 1), a direction signal 152 indicative of a direction of rotation of a target, and an XOR speed signal 154 indicative of an exclusive-OR combination of channel output signals 150a, 150b for example. Additional output signals can be provided on the illustrated or additional signal lines and can include additional channel output signals based on the one more virtual measured magnetic field signals. For example, an angle signal generated by the angle generation unit 149 may be output by the controller 110. These new additional output switching locations can also be incorporated into the existing output signals through the use of logic gates to provide higher resolution position information without the need for additional output pins on the IC. In general, the number of output signal switching events can be referred to as "output commutations" and with generation of virtual magnetic field signals, any desired number of output commutations per pole-pair of the target object can be achieved.

Figure 1C:
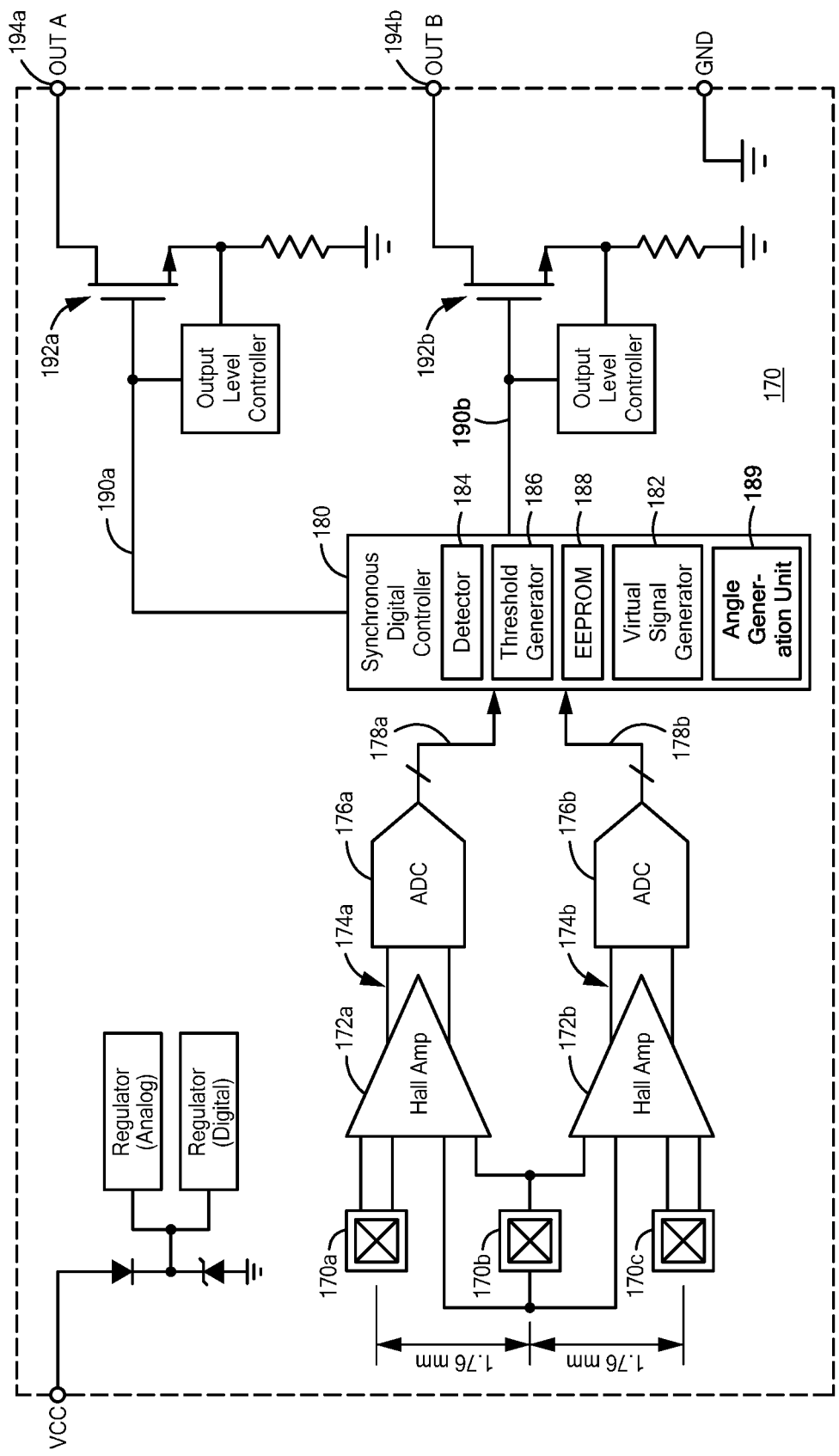
FIG. 1C shows another alternative voltage-level output magnetic field sensor according to the disclosure.

Referring also to FIG. 1C, another alternative magnetic field sensor 170 includes a digital controller 180. Sensor 170 includes a magnetic field sensing element configuration like FIG. 1 and thus includes Hall effect elements 170a, 170b, 170c, each providing an output signal to a respective differential amplifier 172a, 172b to generate respective measured magnetic field signals 174a, 174b, as shown. The phase difference, or separation between measured magnetic field signals 174a, 174b can be approximately ninety degrees (i.e., the signals can be approximately in a quadrature relationship).

Processing of the measured magnetic field signals 174a, 174b can be performed more in the digital domain than in the embodiment of FIG. 1B. Accordingly, measured magnetic field signals 174a, 174b can be converted to respective digital signals by ADCs 176a, 176b, as shown. Offset adjustment, gain control, filtering and other types of signal processing functionality can be implemented by controller 180.

Digital controller 180 is configured to generate one or more virtual magnetic field signals based on the measured magnetic field signals 178a, 178b. To this end, controller 180 can include a virtual signal generator 182, the operation of which will be described further below. Controller 180 can be further configured to generate one or more channel output signals that may be the same as or similar to channel output signals 46a, 46b of FIG. 1. To this end, controller 180 can include a detector 184 that may provide functionality similar to or the same as detectors 36a, 36b of FIG. 1 and a threshold generator 186 that may provide functionality similar to or the same as threshold detectors 40a, 40b. Memory 188, such as EEPROM, can be used to store values for use by the virtual signal generator 182 and the detector 184 for example. The controller 180 can include an angle generation unit 189 which may be similar to the angle generation unit 48c in FIG. 1, 48c' in FIG. 1A, or 149 in FIG. 1B. The angle generation unit 189 is configured to generate an angle signal from magnetic field signals 178a, 178b. The magnetic field signals 178a, 178b may be referred to as "measured magnetic field signals" herein.

One or more output signals 190a, 190b of controller 180 can include channel output signals that may be the same as or similar to channel output signals 46a, 46b (FIG. 1), a direction signal indicative of a direction of rotation of a target, and an XOR speed signal indicative of an exclusive-OR combination of channel output signals for example. An angle signal can additionally be output by the controller 180 as generated by the angle generation unit 189. Additional output signals can be provided on the illustrated or additional signal lines and can include additional channel output signals based on the one more virtual measured magnetic field signals. These new additional output switching locations can also be incorporated into the existing output signals through the use of logic gates to provide higher resolution position information without the need for additional output pins on the IC. Controller output signals 190a, 190b can be coupled to respective output drivers 192a, 192b to provide sensor output signals 194a, 194b containing desired information in a desired format.

Figure 2:
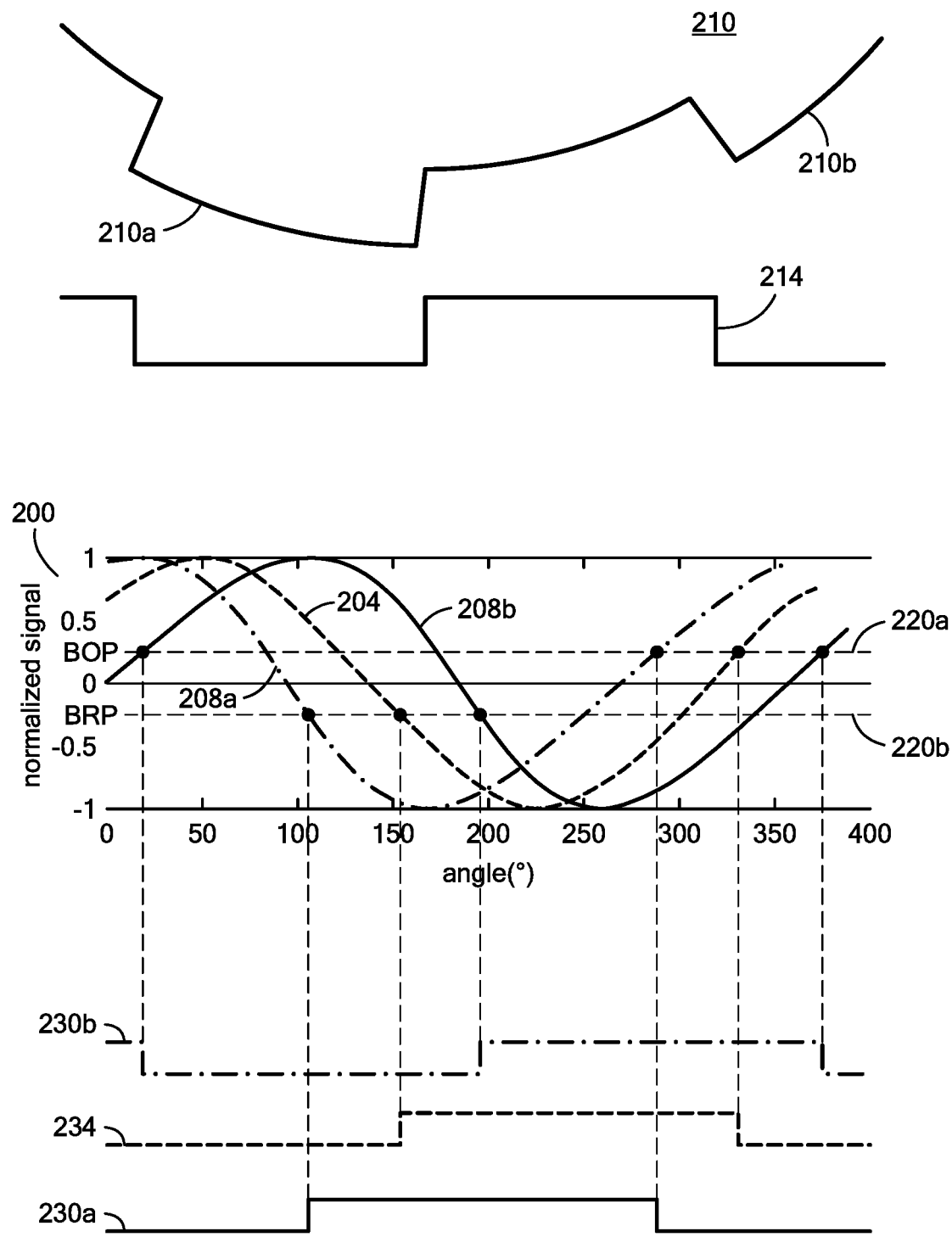
FIG. 2 shows example waveforms, including measured magnetic field signals, a virtual magnetic field signal, and associated channel output signals according to the disclosure as may be generated by any of the sensors of FIGS. 1-1C.

Referring to FIG. 2, generation of a virtual magnetic field signal 204 as may be achieved by any of the above-described sensors 10, 10', 100, 170 (see FIGS. 1-1C, respectively) is illustrated. Virtual magnetic field signal 204 is shown along with measured magnetic field signals 208a, 208b in waveforms 200 against a horizontal axis representing angle in units of degrees and a vertical axis in normalized units of volts.

A target 210 as may be similar to the gear 12 of FIG. 1 includes features 210a, 210b such as may represent gear teeth for example. The mechanical profile of target 210 that reflects the target geometry is represented by waveform 214 having a horizontal axis representing angle in the same units of degrees as waveforms 200.

As the target 210 rotates and features 210a, 210b pass the plurality of sensing elements of the sensor, measured magnetic field signals 208a, 208b are generated. For example, measured magnetic field signals 208a, 208b can correspond to signals 38a, 38b of FIG. 1. Thus, it can be seen that the phase separation of measured magnetic field signals 208a, 208b (referred to herein as a first predetermined phase difference) can be on the order of ninety degrees.

Operate and release threshold levels 220a, 220b (i.e., BOP, BRP, respectively) are shown in relation to the measured magnetic field signals 208a, 208b. As an example, the BOP threshold level 220a can represent a first percentage (e.g., 60%) of the peak-to-peak value of magnetic field signal 208a and the BRP threshold level 220b can represent a second, different percentage (e.g., 40%) of the peak-to-peak value of magnetic field signal 208a. Other threshold levels are possible including but not limited to other percentages of the peak-to-peak magnetic field signal, thresholds that are a predetermined percentage or a predetermined absolute difference with respect to positive and negative peaks of the magnetic field signal, etc.

By operation of detector circuitry (e.g., by detector circuits 36a, 36b of FIG. 1 or controller 110 of FIG. 1B for example), channel output signals 230a, 230b based on respective measured magnetic field signals 208a, 208b are generated. When measured magnetic field signal 208a crosses the BRP threshold level 220b, the respective channel output signal 230a transitions, here to a logic high level, and when measured magnetic field signal 208a crosses the BOP threshold level 220a, the respective channel output signal 230a transitions, here to a logic low level. Channel output signal 230b is generated in a similar manner based on crossings of the measured magnetic field signal 208b with the BOP threshold level 220a and the BRP threshold level 220b, as shown. The result is channel output signals 230a, 230b based on respective measured magnetic field signals 208a, 208b, which channel output signals which have a phase separation relative to one another that is established by the phase separation between the measured magnetic field signals 208a, 208b. Thus, the channel output signals 230a, 230b have the same predetermined phase separation with respect to each other as the measured magnetic field signals 208a, 208b have with respect to each other.

By operation of a controller (e.g., 48a, 48a', 110, 180), virtual magnetic field signal 204 is generated based on the measured magnetic field signals 208a, 208b with a second predetermined phase difference with respect to at least one of the signals 208a, 208b. In embodiments, the second predetermined phase difference can be with respect to each of the measured magnetic field signals 208a, 208b resulting in the virtual signal 204 being evenly spaced with respect to both signals 208a, 208b. In other embodiments, the virtual signal 204 can be unevenly spaced with respect to signals 208a, 208b (i.e., virtual signal 204 can be closer to signal 208a than it is to signal 208b).

The sensor may be user programmable to select a desired number of virtual magnetic field signals to be generated and also to select the desired phase difference between the virtual magnetic field signal(s) and the measured magnetic field signals. For example, the sensor may permit a user to select a desired resolution and, on that basis, the controller can determine how many virtual magnetic field signals will be generated and their respective phases, as will be illustrated in connection with FIG. 4.

Detector circuitry and techniques can be used to process the virtual magnetic field signal 204 to generate a respective virtual channel output signal 234 based on crossings of the virtual magnetic field signal 204 with the threshold levels 220a, 220b. When virtual magnetic field signal 204 crosses the BRP threshold level 220b, the respective virtual channel output signal 234 transitions, here to a logic high level, and when virtual magnetic field signal 204 crosses the BOP threshold level 220a, the respective virtual channel output signal 234 transitions, here to a logic low level, as shown.

Figure 3:
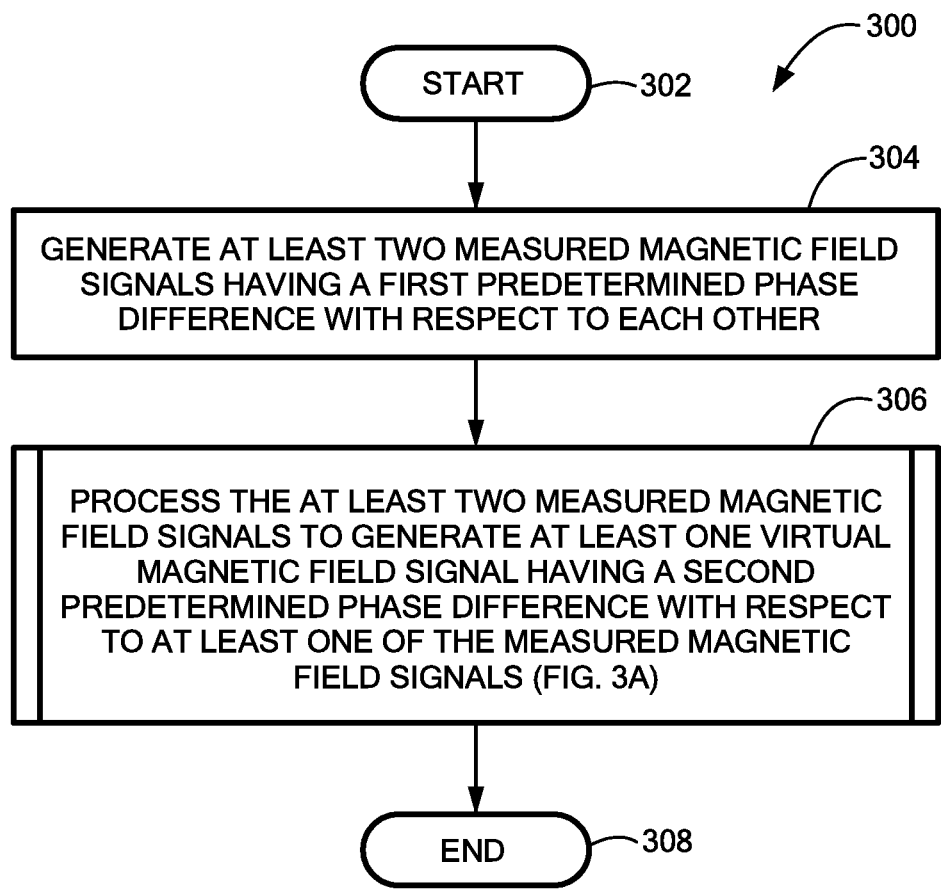
FIG. 3 is a simplified flow diagram illustrating a method of generating one or more virtual magnetic field signals according to the disclosure.

Referring also to the flow diagram of FIG. 3, a method 300 of generating a virtual magnetic field signal begins at block 302, following which at least two measured magnetic field signals having a first predetermined phase difference with respect to each other are generated in block 304. Generating the magnetic field signals may be accomplished with magnetic field sensing elements, such as the Hall effect elements 20a, 20b, 20c of FIGS. 1 and 1A or the magnetoresistance elements 20a', 20b' in FIG. 1B, for example.

In block 306 (as shown in more detail in FIG. 3A), the phase separated measured magnetic field signals are used to generate at least one virtual magnetic field signal having a second predetermined phase difference with respect to at least one of the magnetic field signals, as may be accomplished with sensor controller circuitry and techniques. The measured and virtual magnetic field signals can be processed by detector circuitry and techniques to generate respective channel output signals for communicating high resolution information (referred to generally as output commutations) about the target angle for example.

Figure 3A:
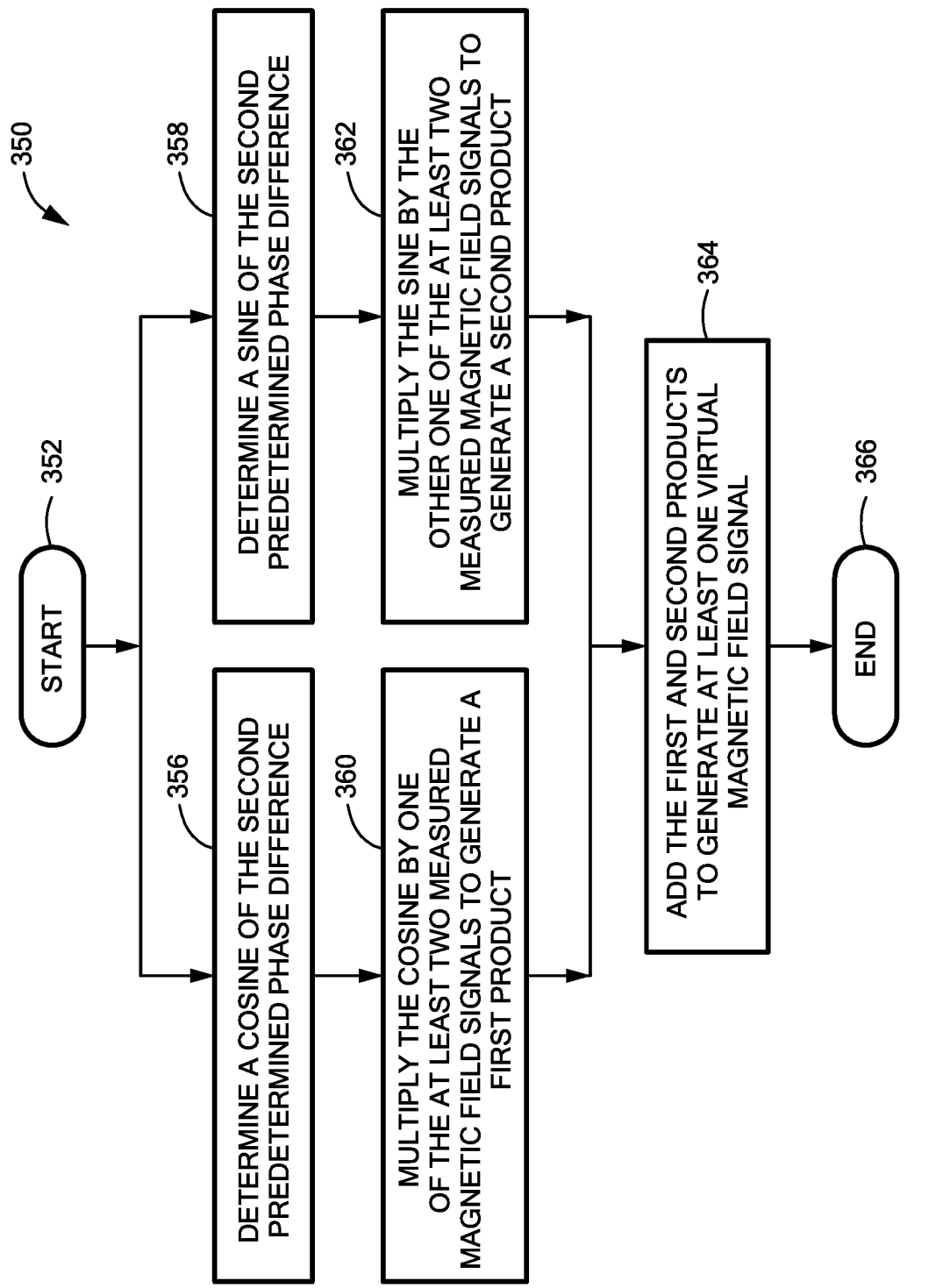
FIG. 3A is a flow diagram illustrating a method of generating one or more virtual magnetic field signals according to the disclosure.

An example subprocess for generating the virtual magnetic field signal is illustrated by the flow diagram of FIG. 3A and can include the use of a mathematical function that characterizes a relationship between the second predetermined phase difference and the measured magnetic field signals. For example, values of the virtual magnetic field signal can be computed according to the following mathematical function, Equation 1:

$$\cos(\text{phase}) * Ch1 + \sin(\text{phase}) * Ch2 \quad \text{Equation 1}$$

where "phase" represents the second predetermined phase separation between the virtual magnetic field signal and the measured magnetic field signals relative to a single period of the measured magnetic field signal (e.g., a target rotation from an edge of one feature to a like edge of the next feature). Thus, in the example of FIG. 2, where it is desired to generate a single virtual magnetic field signal 204 evenly spaced between signals 208a, 208b, "phase" is given by 45°. In the above function, "Ch1" represents the magnitude of one of the measured magnetic field signals (e.g., 208a) and "Ch2" represents the magnitude of the other one of the measured magnetic field signals (e.g., 208b).

The subprocess 350 of FIG. 3A begins at block 352. In block 356, the cosine of the second predetermined phase is determined and in block 358, the sine of the second predetermined phase is determined. Various components and techniques can be used to determine the desired sine and cosine values. In an example embodiment, a look-up table (as may be stored in EEPROM for example) is used to determine the cosine and sine values. This type of configuration can be desirable in sensors containing binary digital logic since sine and cosine function computations can be difficult to implement. In other embodiments, such as those containing a microprocessor, the sine and cosine values can be computed directly.

Considering embodiments using a look-up table (Table 1) to determine the desired sine and cosine values, contents of an example look-up table can be given by the following:

TABLE 1

| Virtual Phase | Cos(virtual phase) | Approximate decimal value of cos(virtual phase) | Binary equivalent of approximate decimal value of cos (virtual phase) | Sin(virtual phase) | Approximate decimal value of sin(virtual phase) | Binary equivalent of approximate decimal value of sin (virtual phase) |
|---|---|---|---|---|---|---|
| 30 | 0.866 | 0.8125 | 0.1101 | 0.5 | 0.5 | 0.1000 |
| 45 | 0.707 | 0.6875 | 0.1011 | 0.707 | 0.6875 | 0.1011 |
| 60 | 0.5 | 0.5 | 0.1000 | 0.866 | 0.8125 | 0.1101 |
| 120 | −0.5 | −0.5 | −0.1000 | 0.866 | 0.8125 | 0.1101 |
| 135 | −0.707 | −0.6875 | −0.1011 | 0.707 | 0.6875 | 0.1011 |
| 150 | −0.866 | −0.8125 | −0.1101 | 0.5 | 0.5 | 0.1000 |

In an implementation containing a look-up table, a binary equivalent of a decimal approximation of the desired sine and cosine values can be used. For example, considering generation of the virtual magnetic field signal 204 (FIG. 2) in which the desired virtual phase is 45°, in block 356 binary equivalent value 0.1011 of the cosine of 45° can be determined. In block 358, binary equivalent value of 0.1011 of the sine of 45° can be determined.

Furthermore, because the cosine values can be negative for some desired phase separations of the virtual magnetic field signal, the ADC(s) that convert the measured magnetic field signals to digital values can be offset such that a midpoint of available codes corresponds to zero. For example, in the case of a 12-bit ADC providing 4096 codes, the midpoint code of 2048 can be used to represent zero volts.

Having thus determined the cosine and sine values for the desired phase for the virtual signal being generated, the binary equivalent value can provide a fixed coefficient for use in subsequent process blocks 360, 362. In block 360, the cosine value thus determined is multiplied by the value of one of the measured magnetic field signals (e.g., Ch1 as may correspond to signal 208a) and in block 362, the sine value thus determined is multiplied by the value of the other one of the measured magnetic field signals (e.g., Ch2 as may correspond to signal 208b). In block 364, the products determined in blocks 360 and 362 are added to thereby determine the corresponding value of the virtual magnetic field signal (e.g., signal 204) and the subprocess ends at block 366.

Figure 4:
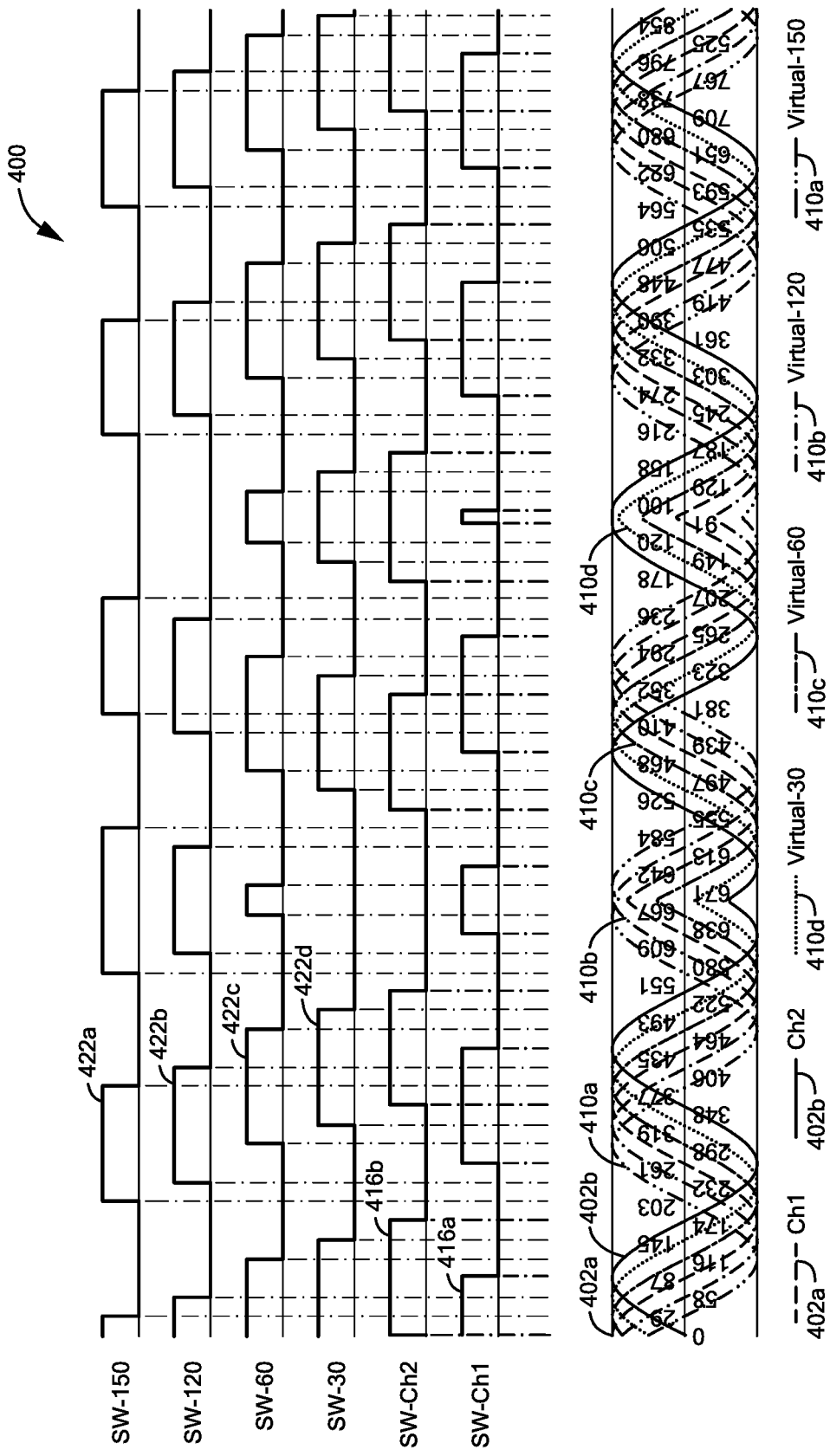
FIG. 4 shows example waveforms, including measured magnetic field signals, a plurality of virtual magnetic field signals, and associated channel output signals according to the disclosure as may be generated by any of the sensors of FIGS. 1-1C.

Referring also to FIG. 4, example waveforms 400 are shown in connection with a sensor generating more than one virtual magnetic field signal, and here four virtual magnetic field signals 410a, 410b, 410c, 410d. Also shown are measured magnetic field signals 402a, 402b against a horizontal axis representing angle in units of degrees and a vertical axis in normalized units of volts.

In the example of FIG. 4, each of the virtual magnetic field signals 410a-410d is evenly spaced between the measured magnetic field signals 402a, 402b. Thus, the phase separation between each consecutive signal 402a, 402b, 410a, 410b, 410c, and 410d is 30°.

The number of virtual signals and the phase separation between the virtual signals can be determined by the sensor controller in response to a user selection of a programming option. In the illustrated example, the user may have selected to receive twelve edges for each period, or gear tooth for example. With such resolution selected and based on knowledge of the target (i.e., how many periods the target represents), the sensor controller can determine that four virtual magnetic field signals with a phase separation of 30° between each other and between each of the measured magnetic field signals should be generated. Alternatively, a user can provide a "resolution improvement factor" where the standard 4 edges per period generated by the physical channels could be scaled by 2× (resulting in 8 edges) or 3× (resulting in 12 edges) by using added virtual channels.

By detector operation, each of the magnetic field signals 402a, 402b, 410a, 410b, 410c, and 410d can be processed to generate a respective channel output signal according to threshold crossings as discussed above. For example, measured magnetic field signals 402a, 402b can be used to generate respective channel output signals 416a, 416b and virtual magnetic field signals can be used to generate respective virtual channel output signals 422a, 422b, 422c, and 422d.

Consideration of the measured channel output signals 416a, 416b reveals that, for each period (i.e., from one target tooth edge to the like edge of the next tooth), four switch events (i.e., four transitions of measured channel output signals 416a, 416b) occur. By contrast, use of both the measured channel output signals 416a, 416b and the four virtual channel output signals 422a, 422b, 422c, 422d results in twelve switch events per period. Accordingly, a 3× improvement in target sensing resolution is achieved.

It will be appreciated that in applications in which the required number of virtual signals is an odd number, the measured channel output signals may not be used for target detection. In other words, if the number of virtual signals is such that their even phase separation within each 360° period would result in uneven phase separation with respect to the measured magnetic field signals, then only the virtual channel output signals may be used to control the target. For example, if the user programmed resolution and target are such as to require that five virtual magnetic field signals be generated at relative phases of 72°, 144°, 216°, 288°, and 360°, then the measured magnetic field signals at approximately 0° and 90° can be ignored for target control purposes.

Also illustrated in FIG. 4 are two direction changes which can represent a change in the direction of rotation of the target. As noted above, the relative lead or lag of edges of the channel output signals can be used to determine the direction of rotation of the target. The increased target detection resolution provided by the virtual channel output signals 422a, 422b, 422c, 422d can result in a more rapid determination of a direction change than otherwise possible.

It will be appreciated that the aforementioned virtual signal generation assumes that the measured magnetic field signals used to generate the virtual magnetic field signals have a perfect quadrature relationship (i.e., there is no "phase error" or deviation from perfect quadrature between the first and second measured magnetic field signals). Traditionally, the only way to ensure sensor outputs in quadrature was to mechanically position two sensors on difference phases (positions) of the target, or to use a single IC solution with two channels in a single IC and have the target designed to have a period exactly two times the mechanical separation of the channels in the IC. This requires a very specific sensor configuration that is not readily applicable to multiple target environments. As a result, the phase difference of the measured magnetic field signals may not be 90-degrees (i.e., there may be a phase error between the measured magnetic field signals) in which case errors can occur when determining wheel displacement or other calculations based on the virtual magnetic field signals.

Figure 5:
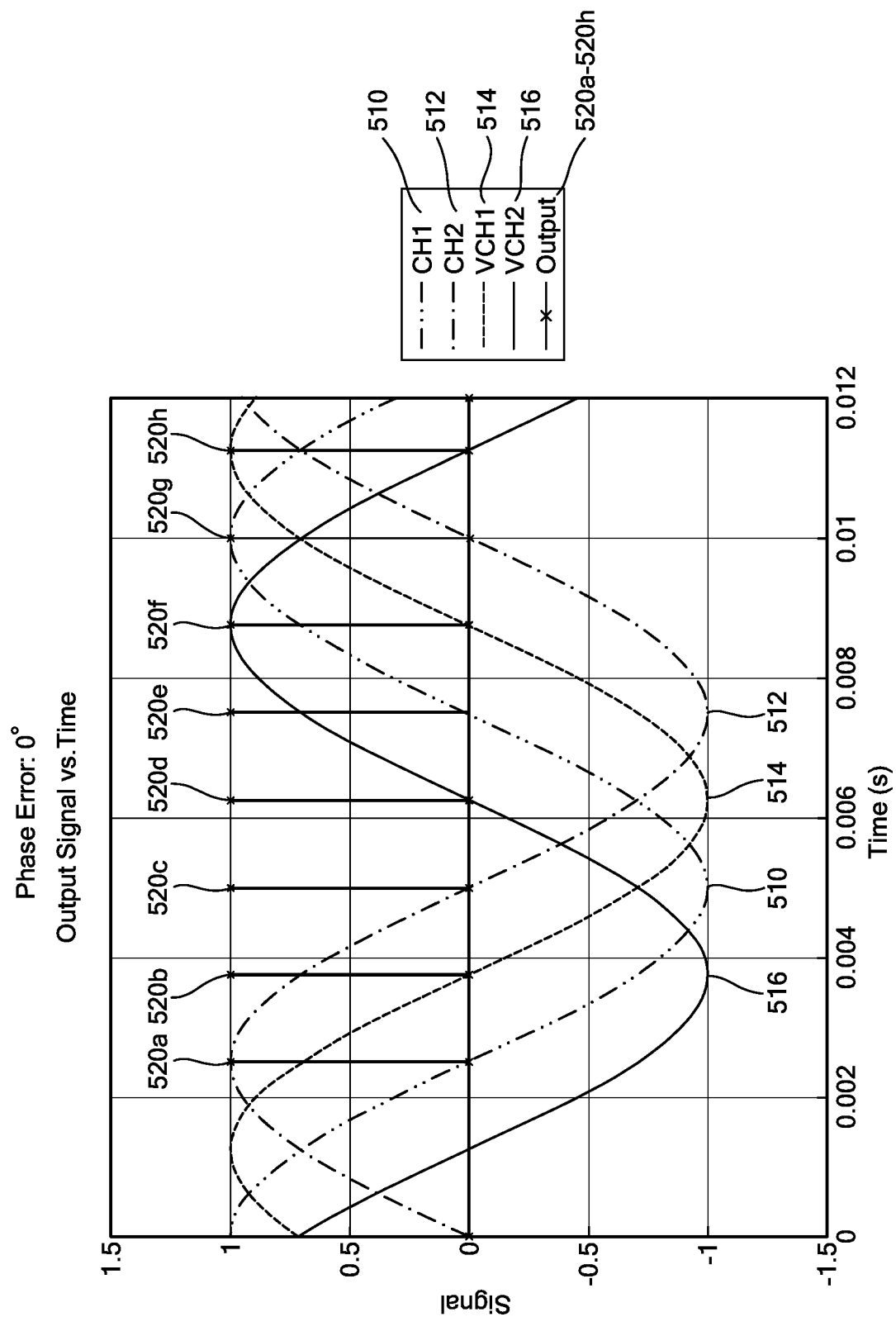
FIG. 5 shows example waveforms of two measured magnetic field signals and two virtual magnetic field signals, and the associated output pulses, where there is no phase error between the first and second channels that generate the measured magnetic field signals.

FIG. 5 shows example waveforms of two measured magnetic field signals 510, 512 and two virtual magnetic field signals 514, 516 generated from the measured magnetic field signals 510, 512 in the manner set forth above where the measured magnetic field signals 510, 512 are in quadrature. Also shown in FIG. 5 are channel output signals in the form of output pulses 520a-520h based on each of the measured and virtual magnetic field signals 510, 512, 514, 516 crossing a threshold. As is apparent, the output pulses 520a-520h are equally spaced apart. This equidistant output pulse spacing is achieved by virtual signals 514, 516 being precisely 90-degrees with respect to each other and precisely 30-degrees with respect to each measured magnetic field signal 510, 512. It will be appreciated that although the illustrated output pulses 520a-520h correspond to the zero crossing points of measured magnetic field signals 510, 512 and the virtual magnetic field signals 514, 516, other threshold levels could be used.

Figure 6:
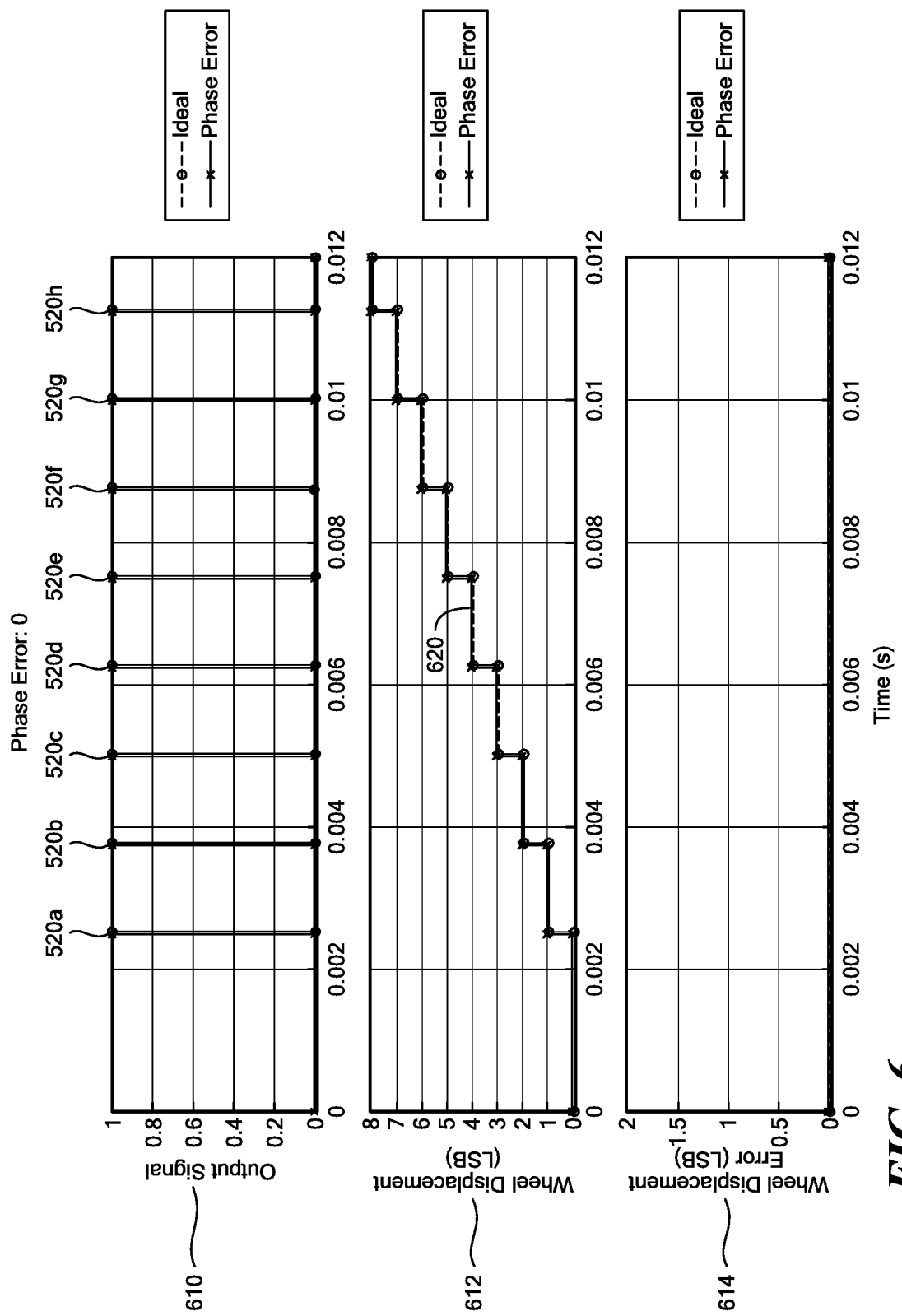
FIG. 6 shows example waveforms of the output signal, wheel displacement, and wheel displacement error, where there is no phase error between the first and second channels that generate the measured magnetic field signals.

As shown for example in FIG. 6, providing a channel output signal 610 with equidistant output pulses 520a-520h allows for processing of the magnetic field signals without error, or with minimal error, as shown for example in FIG. 6. Also show in FIG. 6 is wheel displacement 612, and wheel displacement error 614, where there is no phase error between the first and second measured magnetic field signals. As shown in graph 610, by providing equidistant output pulses 520a-520g, the wheel displacement 620 in graph 612 is equally stepped through the positions, and the resulting graph 614 shows no wheel displacement error.

Figure 7:
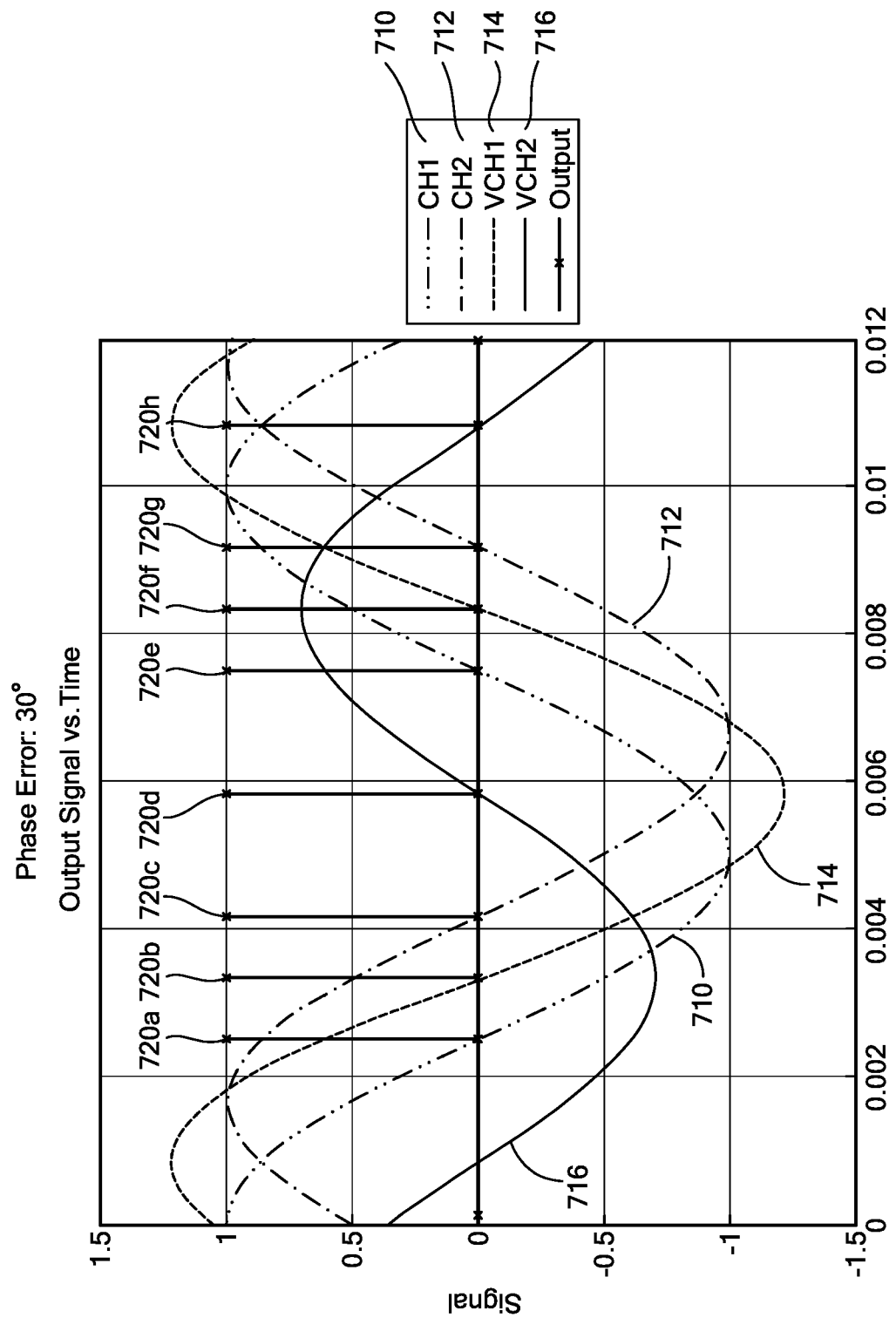
FIG. 7 shows example waveforms of two measured magnetic field signals and two virtual magnetic field signals, and the associated output pulses, where there is a 30-degree phase error between the first and second channels that generate the measured magnetic field signals.
Figure 8:
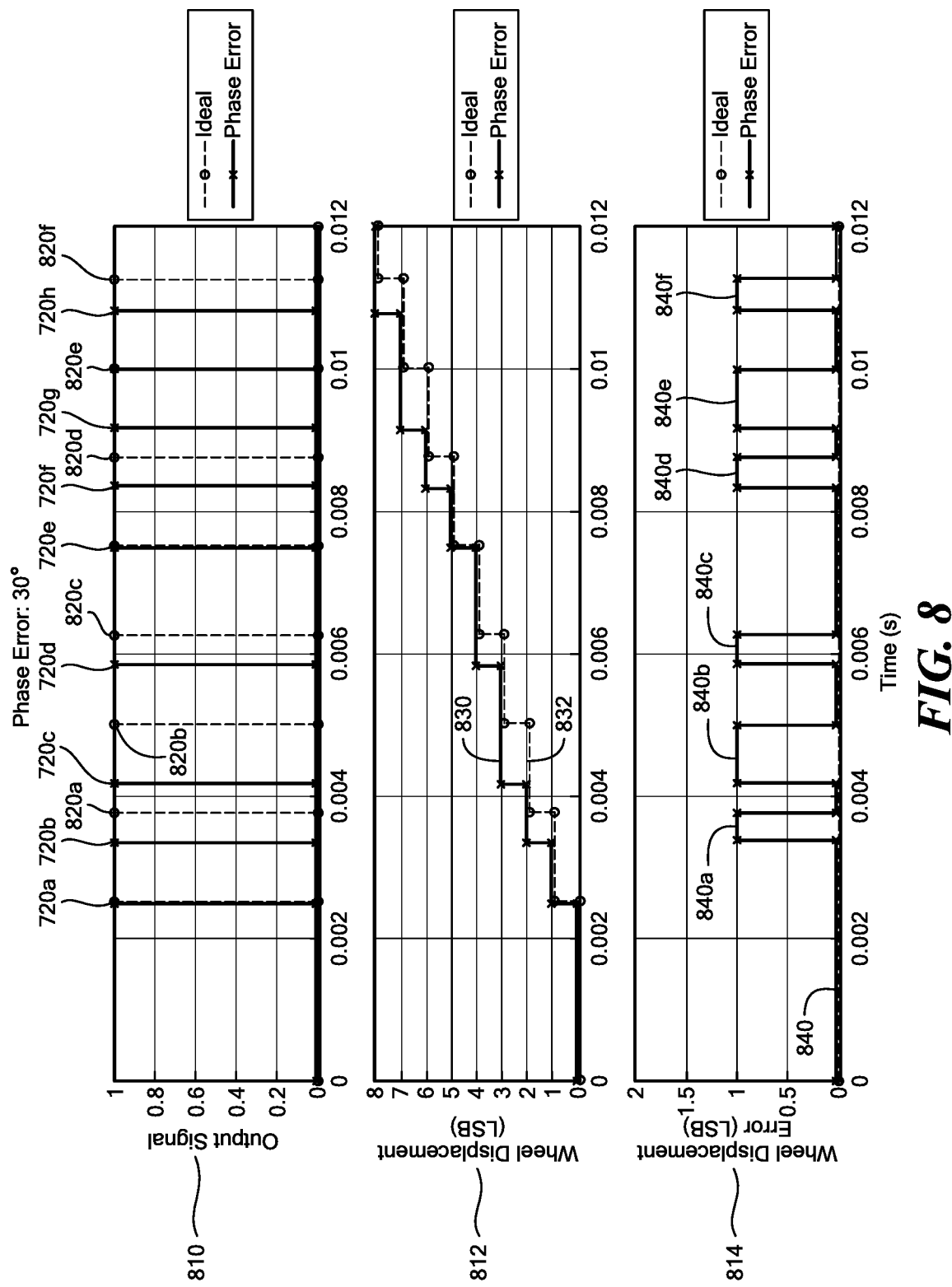
FIG. 8 shows example waveforms of the output signal, wheel displacement, and wheel displacement error, where there is a 30-degree phase error between the first and second channels that generate the measured magnetic field signals.

FIG. 7 shows example waveforms of two measured magnetic field signals 710, 712 having a 30-degree phase error between the measured magnetic field signals 710, 712, and two virtual magnetic field signals 714, 716 generated from the measured magnetic field signals 710, 712 in the manner described above. As is apparent, the resulting channel output signal pulses 720a-720g are not equidistant, which can result in wheel displacement error, as shown in FIG. 8. Furthermore, when the measured magnetic field signals 710, 712 are not in perfect quadrature, the amplitude of the resulting virtual signals 714, 716 will not match the amplitude of the measured magnetic field signals 710, 712, as shown.

FIG. 8 shows example waveforms of the output signal 810 including non-equidistant pulses 720a-720h, wheel displacement 812, and wheel displacement error 814, where there is a 30-degree phase error between the measured magnetic field signals 710, 712. Also shown in graph 810 are ideal output pulses 820a-820e (pulses 820a, 820b, 820c, 820d, and 820e at the ideal locations). The actual wheel displacement 830 and ideal wheel displacement 832 are shown in graph 812. This discrepancy results in a wheel displacement error shown in graph 814. The wheel displacement error signal 840 has several locations 840a, 840b, 840c, 840d, 840e, and 840f, where there is an error due to the output pulses 720a-720h not being equidistant in spacing.

Thus, in order to minimize processing errors, it is important for the measured and/or virtual magnetic field signals to have a predetermined phase separation with respect to each other. In some instances, the measured magnetic field signals will have a quadrature relationship and thus, the virtual magnetic field signals based on such quadrature signals will have the desired, predetermined phase separation with respect to the measured magnetic field signals and to each other.

Rather than relying on the measured magnetic field signals to have the desired quadrature relationship, according to a further aspect, virtual quadrature magnetic field signals (or simply referred to herein as "virtual quadrature signals") can be computationally generated to have a quadrature relationship with respect to at least one of the measured magnetic field signals, which measured magnetic field signals need not be in perfect quadrature. FIGS. 9-12 are associated with generating virtual quadrature magnetic field signals.

As another alternative to relying on the measured magnetic fields signals to have the desired quadrature relationship, according to a further aspect, generating virtual magnetic field signals can be based on the use of generalized coefficients. The resulting virtual magnetic field signals can be referred to as virtual arbitrary magnetic field signals or simply referred to herein as "virtual arbitrary signals" since these generated virtual signals need not have a quadrature relationship as will result from the process of FIG. 12 for example. Generation of such virtual arbitrary signals is described below in connection with FIGS. 13-14.

Figure 9:
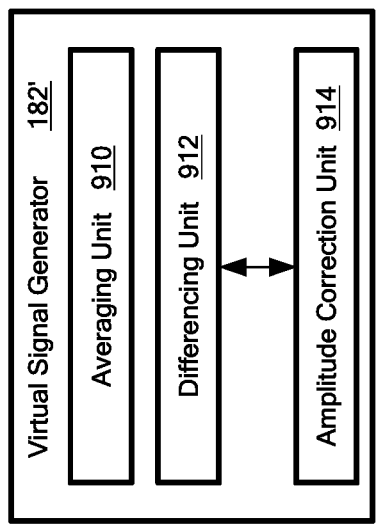
FIG. 9 is a diagram of an example virtual signal generator for generating virtual quadrature magnetic field signals, according to the disclosure.
Figure 10:
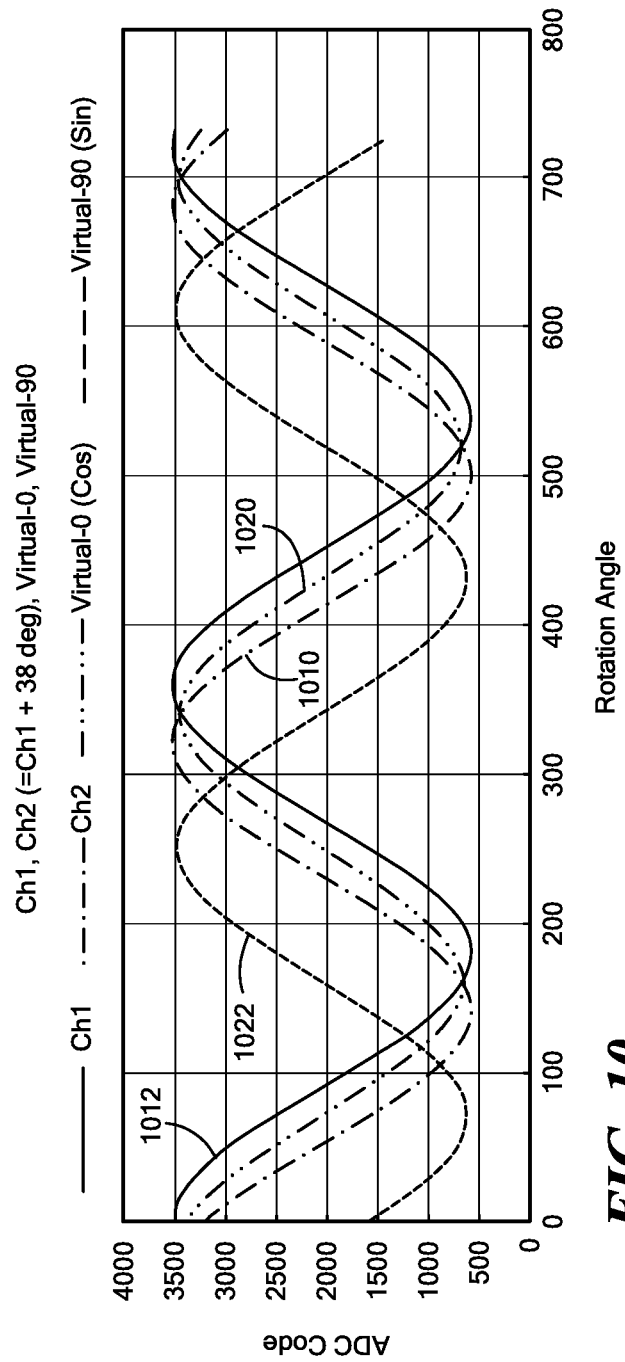
FIG. 10 shows example waveforms of measured magnetic field signals and two virtual quadrature magnetic field signals, according to the disclosure.

It may be desirable to generate virtual signals that are at a predetermined 90-degree phase difference with respect to each other, referred to herein as virtual quadrature signals. These virtual quadrature signals can be used in further processing of FIGS. 1-4. FIG. 9 is a diagram of an example virtual signal generator 182' for generating virtual quadrature signals, according to the disclosure. The virtual signal generator 182' can be the same as, or similar to, the virtual signal generator 182 shown in FIG. 1C, or the virtual signal generator 142 shown in FIG. 1B and can be configured to generate both virtual magnetic field signals (e.g., FIGS. 1-4) and the virtual quadrature signals (e.g., FIGS. 9-12). The virtual signal generator 182' is configured to use an averaging unit 910, a differencing unit 912, and an optional amplitude correction unit 914 to generate the virtual quadrature signals (refer, for example, to FIG. 10 showing example virtual quadrature signals 1020, 1022).

Virtual quadrature signals 1020, 1022 can be generated by calculating the average of two input signals (e.g., measured magnetic field signals 1010, 1012 of FIG. 10) to generate a 0-degree reference basis signal (the first virtual quadrature signal) and then calculating the difference of the two input signals to generate a 90-degree out-of-phase signal (the second virtual quadrature signal). The 90-degree out-of-phase signal can be amplitude-adjusted to match the 0-degree reference to provide consistent amplitudes between signals as will be explained. These virtual quadrature signals can further provide the starting point for generating other virtual signals in accordance with, for example, FIGS. 1-4.

When signals are generated by a sensor that has been implemented as an integrated circuit (IC), the position of the sensing elements is critical in performing processing of signals generated by the sensing elements. By mathematically generating virtual quadrature signals, the mechanical separation (and physical location) of the sensing elements in the IC does not have to be matched or otherwise tuned to the target being sensed, allowing for a single IC to be used with many different target geometries. The virtual quadrature signals provide optimal sensor outputs to be used for direction detection, accurate phase calculation, and further virtual signal generation.

The averaging unit 910 computes the average, Z, of the two measured magnetic field signals according to Equation 2:

$$Z = \frac{A+B}{2} \qquad \text{Equation 2}$$

where A is the measured magnetic field signal of the first channel and B is the measured magnetic field signal of the second channel. By adding the two measured magnetic field signals A and B together, and then dividing by two, the first virtual quadrature signal (at zero-degrees) is generated. For digital signals, dividing the signals by two essentially entails truncating the last bit of each digital signal and then adding the two signals. For analog signals, the values are added and divided by two to determine the average. This average provides the virtual 0-degree quadrature signal (the first virtual quadrature signal).

The differencing unit 912 computes the difference, V, of the two measured magnetic field signals according to Equation 3:

$$V = \{[(B-X)-(A-X)] \times K\} + X \qquad \text{Equation 3}$$

where A is the measured magnetic field signal of the first channel, B is the measured magnetic field signal of the second channel, X is the midpoint between the total number of possible codes, and K is an amplitude correction factor. The total number of possible "codes" refers to the maximum number of least significant bits (LSB) of an ADC of the sensor (e.g., ADC 176a, 176b in FIG. 1C, or 138a, 138b in FIG. 1B). When the values of the first channel A and the second channel B are digital values, calculating the difference requires elimination of the fixed offset that centers the signal inside the middle of the ADC range, and this center or "midpoint" needs to be considered. Thus, the midpoint 'X' is subtracted from each channel (B–X) for the second channel, and (A–X) for the first channel, and then the midpoint X is added back in after the value for each channel is multiplied by the amplitude correction factor K. Alternatively, if the values for each channel A and B are analog values, the values can simply be subtracted from each other and then multiplied by an amplitude correction factor K. Calculating the difference according to Equation 3 provides the virtual 90-degree out-of-phase quadrature signal (the second virtual quadrature signal).

FIG. 10 shows example waveforms of measured magnetic field signals 1010 and 1012 and two virtual quadrature magnetic field signals 1020 and 1022 that are generated according to the disclosure. The averaging unit 910 from FIG. 9 generates the first virtual 0-degree quadrature signal 1020 and the differencing unit 912 (with optional amplitude correction unit 914) generates the second virtual 90-degree quadrature signal 1022. Advantageously, the measured magnetic field signals 1010, 1012 can have any phase difference with respect to each other.

Figure 11:
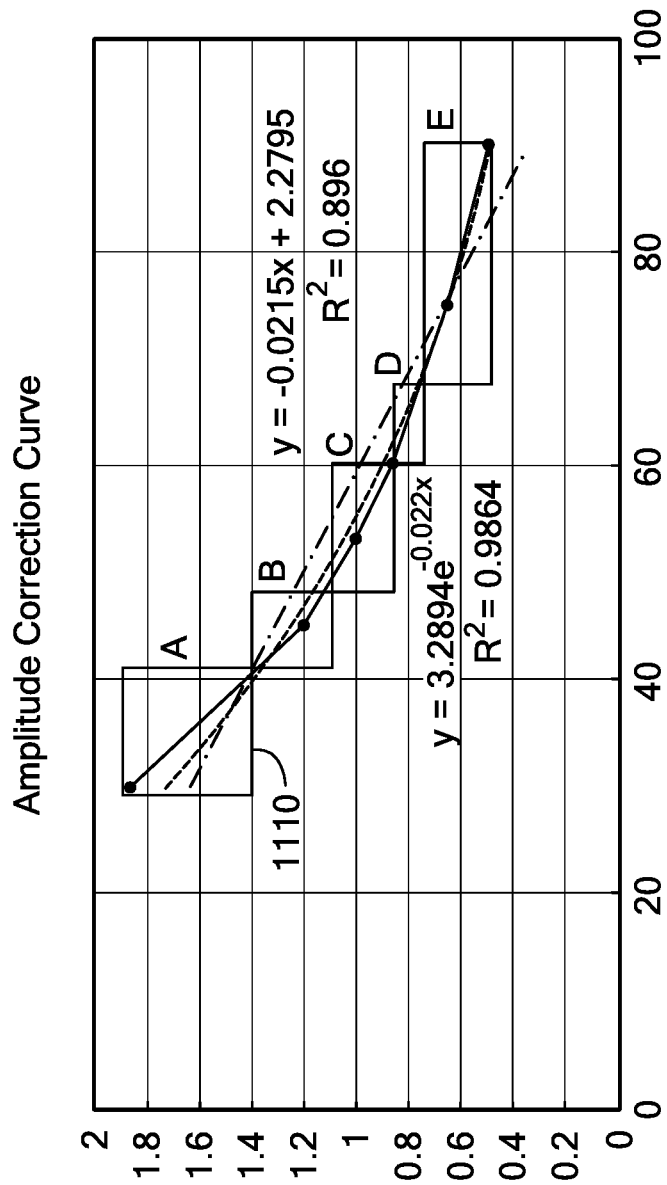
FIG. 11 shows an example waveform for an amplitude correction curve used in generating virtual quadrature magnetic field signals, according to the disclosure.

FIG. 11 shows an example waveform for an amplitude correction curve 1110 that can be used in generating virtual quadrature signals. In some instances when the measured magnetic field signals used to generate the virtual quadrature signals are not in perfect quadrature, the mathematical calculations used to generate the virtual quadrature signals may not result in signals that have the same amplitude. This can be accounted for through further processing that determines the signal amplitudes before generating switching thresholds, or it can be compensated for by applying an amplitude correction to the difference channel (the virtual 90-degree channel) for example using a curve, such as curve 1110.

The amplitude correction curve represents the ratio between the average signal and the difference signal and is used to ensure that the amplitude of both virtual quadrature signals is the same as (or substantially equal to) the amplitude of the measured magnetic field signals. In embodiments, the amplitude correction curve 1110 has a substantially exponential shape, as shown. Because of the exponential nature of the amplitude correction curve 1110, a mathematical correction can be complicated to perform with basic digital logic circuits. In embodiments, the correction curve 1110 can be approximated by linear segments A, B, C, D, and E that correspond to segments of the curve 1110. Thus, simpler binary multiplication can be performed to approximate the exponential curve, for example as shown in the Table 2 below:

TABLE 2

|  | Segment | | | | |
| --- | --- | --- | --- | --- | --- |
|  | A | B | C | D | E |
| Decimal Factor | 1.5 | 1.25 | 1 | 0.75 | 0.625 |
| Binary Equivalent | 1.100 | 1.010 | 1.000 | 0.110 | 0.101 |

Table 2 can be used as a look-up table for determining the appropriate binary equivalent for a decimal factor of the curve. The amplitude correction factor is variable K in Equation 3 above and used in calculating the 90-degree ("second") out-of-phase virtual quadrature signal.

If the amplitudes of the virtual signals start to deviate from each other, this can result in a loss in accuracy and the relationship can degrade, also increasing the amount of noise. By keeping the amplitude consistent using the amplitude correction factor, this allows for better direction determination and better accuracy in the switching locations. By generating two lines at the desired phase shift and maintaining as close to the original amplitude as possible, the virtual signals reduce errors and/or noise in the signal processing.

The amplitude correction factor can be programmed into the IC at the time of manufacture, based upon customer preferences given the known target-sensor relationship based on the known phase separation, or the sensor can detect the phase separation after manufacture and calculate the amplitude correction factor K during normal runtime operation of the magnetic field sensor. The amplitude correction factor is determined based upon an expected value of the phase difference between the at measured magnetic field signals as characterized at time of manufacture. The amplitude correction factor can be stored as a look-up table. The controller of the magnetic field sensor (e.g., controller 180 in FIG. 1C) can be configured to determine the phase difference between the two measured magnetic field signals and use the determined phase difference to select the amplitude correction factor.

Figure 12:
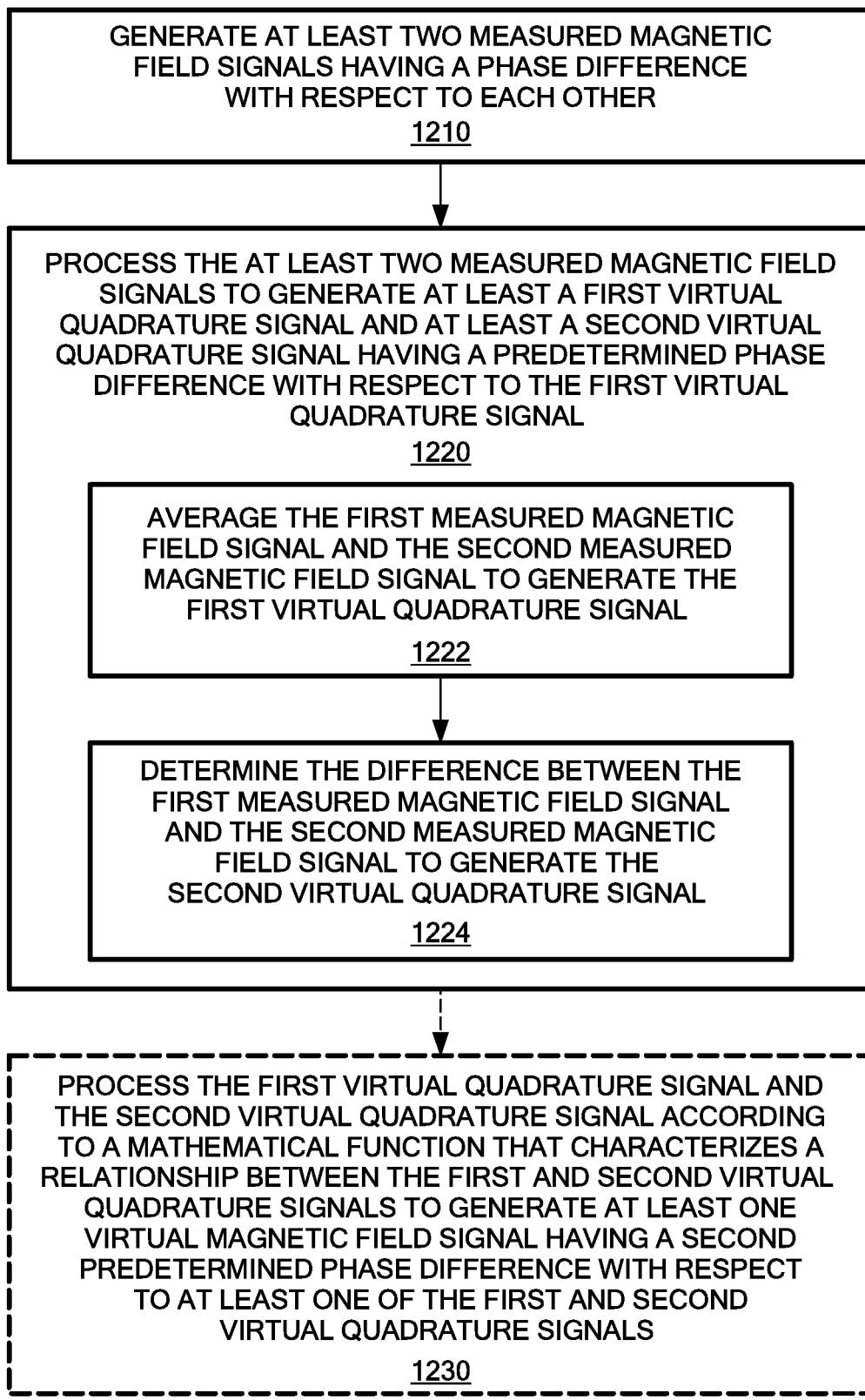
FIG. 12 is a flow diagram illustrating a method of generating one or more virtual quadrature magnetic field signals.

FIG. 12 is a flow diagram illustrating a method of generating one or more virtual quadrature signals. At block 1210, the method starts by generating at least two measured magnetic field signals indicative of a magnetic field affected by an object. The at least two measured magnetic field signals have a phase difference with respect to each other. This phase difference may be known and/or provided by a customer or manufacturer (which may be referred to herein as predetermined) or may be unknown and determined by the magnetic field sensor (e.g., by controller 180) in accordance with the techniques of the present disclosure. The phase difference may, but need not be precisely 90-degrees.

The method continues to block 1220 by processing the at least two measured magnetic field signals to generate at least a first virtual quadrature signal and at least a second virtual quadrature signal. The first and second virtual quadrature signals have a predetermined phase difference with respect to each other, which for example can be 90-degrees to provide the quadrature virtual magnetic field signals. Processing the at least two measured magnetic field signals can include, at block 1222, averaging the first measured magnetic field signal and the second measured magnetic field signal (see, e.g., Equation 2 above) to generate the first virtual quadrature signal. Processing the at least two measured magnetic field signals can further include, at block 1224, determining the difference between the first measured magnetic field signal and the second measured magnetic field signal (see, e.g., Equation 3 above) to generate the second virtual quadrature signal. Processing the at least two measured magnetic field signals can further include (optionally) applying an amplitude correction factor to the second virtual quadrature signal, and the amplitude correction factor is based upon the phase difference between the at least two measured magnetic field signals. Refer, for example, to Equation 3 herein that utilizes the amplitude correction factor, K, in processing the two measured magnetic field signals. It will be appreciated that the amplitude correction factor processing is not always required and may be omitted in some implementations.

In accordance with the techniques described herein, at block 1230, the first virtual quadrature signal and the second virtual quadrature signal can be processed according to a mathematical function (e.g., Equation 1) that characterizes a relationship between the first and second virtual quadrature signals to generate at least one virtual magnetic field signal having a predetermined phase difference with respect to at least one of the first and second virtual quadrature signals. As such, the first and second virtual quadrature signals can be further processed to achieve any number of virtual magnetic field signals using these idealized virtual quadrature signals as a starting point, for example using the techniques from FIGS. 1-4.

In some instances, it may be desirable to generate virtual signals having any arbitrary phase difference with respect to each other (e.g., rather than having the quadrature phase difference that results from the process of FIG. 12 for example) and not being dependent on starting with measured magnetic field signals that are in perfect quadrature in order improve the accuracy of processing the virtual signals. It is desirable to have high accuracy and equidistant output signal pulse or transition spacing when performing, for example, wheel displacement calculations, or the error can be very large (refer, for example, to FIG. 8 showing a large error in wheel displacement).

Figure 13:
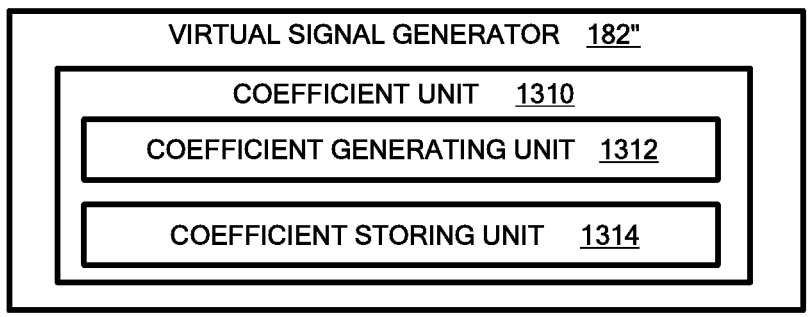
FIG. 13 is a diagram of an example virtual signal generator for generating virtual arbitrary magnetic field signals, according to the disclosure.

FIG. 13 is a diagram of an example virtual signal generator 182″ for generating virtual arbitrary signals, according to the disclosure. The virtual signal generator 182″ can be the same as, or similar to, the virtual signal generator 182′ shown in FIG. 9, the virtual signal generator 182 shown in FIG. 1C, or the virtual signal generator 142 shown in FIG. 1B and can be configured to generate each of the virtual magnetic field signals (e.g., FIGS. 1-4), the virtual quadrature signals (e.g., FIGS. 9-12) and the virtual arbitrary signals (e.g., FIGS. 13-14). The virtual signal generator 182″ uses a coefficient unit 1310 to generate virtual arbitrary magnetic field signals, also referred to herein more generally as virtual arbitrary signals. Any of the controllers 182, 182', or 182" can be used to generate each of the virtual signals shown and/or described herein.

The coefficient unit 1310 includes a coefficient generating unit 1312 for generating the coefficient when the coefficient is generated on-chip (i.e., within the controller of the magnetic field sensor) and a coefficient storing unit 1314 for storing the coefficient when the coefficients are generated both on-chip and off-chip (i.e., at time of manufacture). The techniques herein implement both on-chip and off-chip processing of the coefficients for the mathematical functions to calculate the virtual arbitrary signals. Meaning, the on-chip processing determines the phase difference and the coefficients on the magnetic field sensor chip (i.e., by controller 182, 182', or 182") and the off-chip processing determines the coefficients during the manufacture of the sensor and these values are stored and used later by the controller during operation of the sensor. It will be appreciated that when the phase difference between the two measured magnetic field signals is known, the coefficients can be calculated off-chip using this known phase difference (based on a shape of the object and an airgap between the magnetic field sensor and the object), and when the phase difference is not known, it can be determined on-chip and used to determine the coefficients on-chip as well. Because the air gap between the sensor and the target object is known, this provides the circumference of the target object that is presented to the magnetic field sensor, and the sensing elements have a known specific spacing, so the resulting phase shift can be calculated. Thus, by measuring the two channels, the phase difference can be calculated on-the-fly (on-chip) by the coefficient generation unit 1312.

The virtual signal generator 182" is responsive to the at least two measured magnetic field signals generated by the magnetic field sensing elements (e.g., 20a, 20b, 20c of FIG. 1, 20a', 20b' of FIG. 1A, 118a, 118b, 120 of FIG. 1B, 170a, 170b, 170c, of FIG. 1C) and is configured to generate at least one virtual magnetic field signal having a second predetermined phase difference with respect to at least one of the measured magnetic field signals. The second predetermined phase difference may be any arbitrary value. In some embodiments, the second predetermined phase difference depends upon the number of equidistant output pulses desired per cycle of the magnetic field signal. For example, Table 3 shows various embodiments where more than a single virtual channel is generated for a particular application, as well as the corresponding $\phi_i$ increment (the intended phase increment between each virtual channel).

TABLE 3

| Desired Number of Equidistant Output Commutations | Number of Virtual Channels Required | $\phi_i$ Increment (°) | $\phi_i$ Values (°) |
|---|---|---|---|
| 4 | 1 | 90 | −90 |
| 6 | 2 | 60 | −60, −120 |
| 8 | 3 | 45 | −45, −90, −135 |
| 10 | 4 | 36 | −36, −72, −108, −144 |
| 12 | 5 | 30 | −30, −60, −90, −120, −150 |

In general, each virtual channel allows for at least two additional output commutations in single threshold applications (e.g., the rising and falling portions of the sinusoidal magnetic field signal). The number of output commutations are shown as each output pulse (for example, refer to FIG. 5 showing output pulses 520a-520h, each equidistant in spacing). Accordingly, the number of output commutations ($N_{OC}$) is dependent upon the number of virtual channels ($N_{VC}$), as shown in Equation 4 below:

$$N_{OC}=2\times(N_{VC}+1) \quad\text{Equation 4}$$

Note that the virtual channel provides two output communications in a single threshold implementation ($2 \times N_{VC}$), and the reference channel (the real channel) will provide two output commutations as well, thus providing $2*N_{VC}+2$ total number of channels, simplified into Equation 4 above. Note that there is a ratio between the number of virtual channels and the number of output commutations of two times the number of virtual channels plus one.

Accordingly, when there are, for example, 10 equidistant output commutations desired, at least four virtual channels are required, and the increment for the phase is thus 36 degrees. More specifically, when taking 360, the total number of degrees, and dividing by 10, the number of output commutations, then one arrives at 36 which is phase increment $\phi_i$ per channel). Thus, each virtual channel must be separated by 36 degrees, and the resulting phase difference values for each virtual signal are 36-degrees, 72-degrees, 108-degrees, and 144-degrees. As shown in Table 3, the second predetermined phase difference of the virtual arbitrary signal generated from the first and second measured magnetic field signals can have a phase shift of (a) 90-degrees, or (b) 60-degrees and 120-degrees, or (c) 45-degrees, 90-degrees, and 135-degrees, or (d) 36-degrees, 72-degrees, 108-degrees, and 144-degrees, or (e) 30-degrees, 60-degrees, 90-degrees, 120-degrees, and 150-degrees. Other phase differences are possible as will be appreciated in light of the present disclosure.

Figure 14:
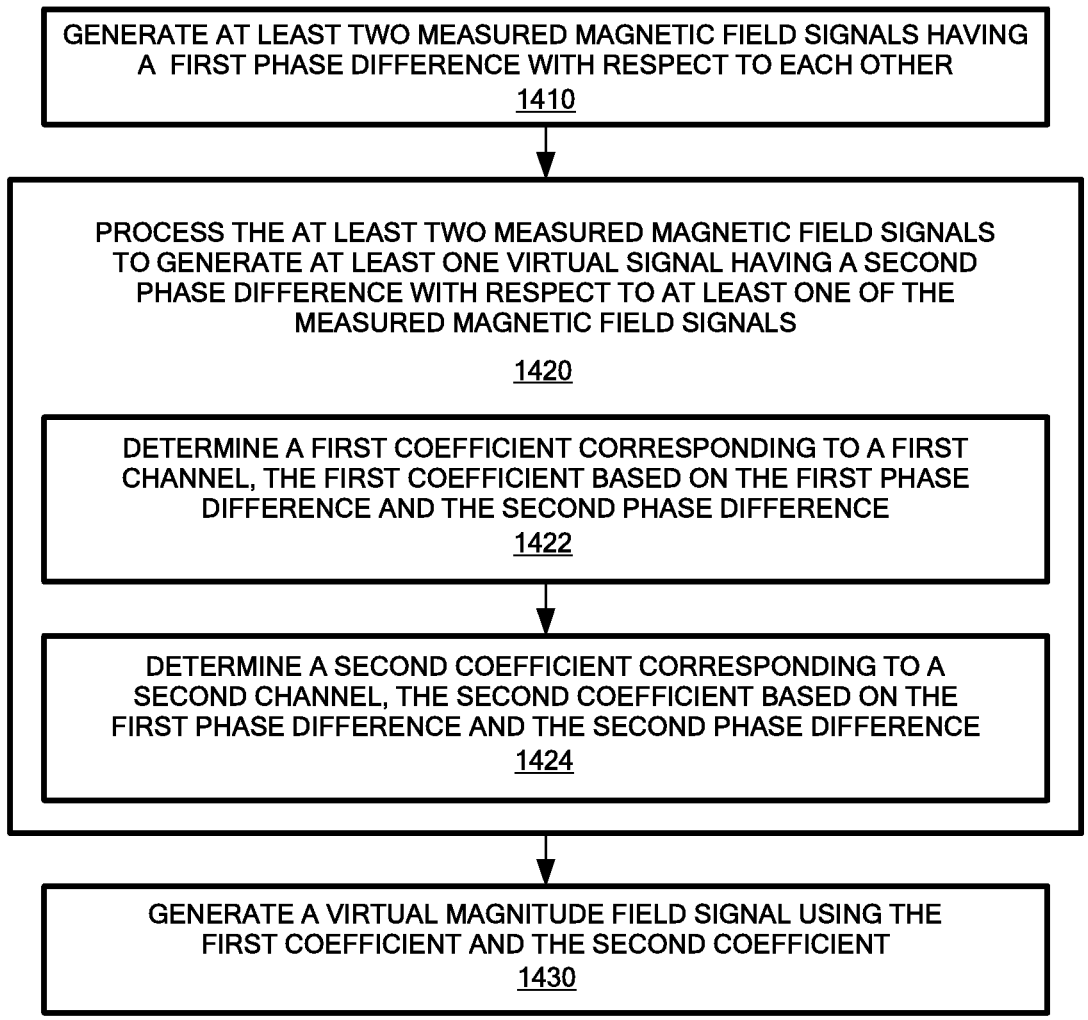
FIG. 14 is a flow diagram illustrating a method of generating one or more virtual arbitrary magnetic field signals, according to the disclosure.

FIG. 14 is a flow diagram illustrating a method of generating one or more virtual arbitrary signals, according to the disclosure. At block 1410, the method starts by generating at least two measured magnetic field signals indicative of a magnetic field affected by an object. The at least two measured magnetic field signals have a phase difference with respect to each other, which phase difference may, but need not be 90-degrees.

At block 1420, the measured magnetic field signals are processed to generate at least one virtual signal having a second phase shift with respect to at least one of the measured magnetic field signals. The second phase shift is predetermined to provide the virtual signal with an arbitrary phase shift relative to at least one of the measured magnetic field signals in order to achieve a desired number of output commutations (e.g., equidistant output pulses). At block 1422, a first coefficient is determined corresponding to a first channel, the first coefficient is based on the first phase difference and the second phase difference. At block 1424, a second coefficient is determined corresponding to a second channel, the second coefficient based on the first phase difference and the second phase difference. The first and second coefficient are then used at block 1430 to generate at least one virtual magnetic field signal using the first coefficient and the second coefficient. The measured magnetic field signals are processed according to the following mathematical formula(es) to achieve the desired number of arbitrary virtual channel(s) by generating the first coefficient and the second coefficient.

To generate one or more arbitrarily shifted phase signal virtual signals, the two measured magnetic field signals are processed (e.g., by controller 182, 182', or 182"). The two sinusoidal-shaped signals, or generally measured magnetic field signals, are denoted "L" and "R" in the following equations 5 and 6, and are arbitrarily shifted with respect to each other.

$$L = A_L \cdot \cos(2\pi ft) + O_L \quad \text{Equation 5}$$

$$R = A_R \cdot \cos(2\pi ft + \phi_P) + O_R \quad \text{Equation 6}$$

The phase shift between L and R can be arbitrary (as long as it is non-zero) and is denoted as $\phi_P$ in the equations herein. The phase shift, $\phi_P$, between the two channels may be referred to as an "applied phase shift" herein. In Equation 5 and Equation 6, $A_L$ and $O_L$ are the amplitude and offset of L, respectively, and likewise $A_R$ and $O_R$ are the amplitude and offset of R, respectively. An arbitrarily phase shifted virtual channel, $V_i$, could then be defined as in Equation 7:

$$V_i = A_i \cdot \cos(2\pi ft + \phi_i) + O_i \quad \text{Equation 7}$$

where $A_i$, $\phi_i$, and $O_i$ are the desired amplitude of the virtual signal, the desired phase shift relative to L, and the resultant offset, respectively. The desired phase shift, $\phi_i$, between the real (or "reference") channel and the virtual channel may be referred to as an "intended phase shift" herein. This virtual signal can be derived from L and R using Equation 8:

$$Vi = a_i \cdot L + b_i \cdot R \quad \text{Equation 8}$$

where $a_i$ and $b_i$ are two parameters which may be (referred to herein as "the first coefficient" and "the second coefficient" respectively), and depend upon $\phi_P$, $A_i$, and $\phi_i$. The first coefficient $a_i$ and the second coefficient $b_i$ and can be calculated using Equation 9 and Equation 10:

$$a_i = \left(\frac{A_i}{A_L}\right)\left[\cos(\phi i) - \left(\frac{\sin(\phi i)}{\tan(\phi P)}\right)\right] \quad \text{Equation 9}$$

$$b_i = \left(\frac{A_i}{A_R}\right)\left(\frac{\sin(\phi i)}{\sin(\phi P)}\right) \quad \text{Equation 10}$$

In the cases of L and R normalization or when the amplitudes of L, R, and the desired amplitude of $V_i$ are approximately equal, these equations simplify to Equation 11 and Equation 12:

$$a_i = \cos(\phi i) - \left(\frac{\sin(\phi i)}{\tan(\phi P)}\right) \quad \text{Equation 11}$$

$$b_i = \frac{\sin(\phi i)}{\sin(\phi P)} \quad \text{Equation 12}$$

Refer, for example, to FIG. 5 showing two measured magnetic field signals and two virtual signals, as well as equidistant output spacing. By calculating and solving for these coefficients, any number of arbitrary virtual signals can be generated in accordance with the present disclosure. Thus, the virtual channel $V_i$ can be derived from Equation 8 once the coefficients are solved for.

It will be appreciated that the measured magnetic field signals may or may not be used in the further processing, for example determining wheel displacement or other positional information. For example, both the measured magnetic field signals and the generated virtual signals may be used to determine position information, or position information may be determined using only the generated virtual signals. It will be appreciated that in applications in which the required number of virtual signals is an odd number, the measured channel output signals may not be used for target detection. In other words, if the number of virtual signals is such that their even phase separation within each 360° period would result in uneven phase separation with respect to the measured magnetic field signals, then only the virtual channel output signals may be used to control the target. For example, if the user programmed resolution and target are such as to require that five virtual magnetic field signals be generated at relative phases of 60° and 120°, then the measured magnetic field signals at approximately 0° and 90° can be ignored for target control purposes.

It will further be appreciated that although only a single threshold is used for the detectors (e.g., at a 50% midpoint between positive peak and negative peak values), multiple thresholds per signal may be implemented and may be selected to yield communication equidistance. Additional thresholds can improve accuracy of the magnetic field sensor.

Implementing virtual channels according to the techniques disclosed hereinabove may require the virtual channel coefficients (e.g., coefficients $a_i$ and $b_i$ in Equation 8 hereinabove) to be pre-programmed into memory of the sensor based on the target and installation physical parameters (pole-pair count, target radius, air gap, and physical spacing of the sensing elements). According to a further aspect of the disclosure, a real channel and a virtual channel can be used with a feedback loop to calculate and regulate the coefficients, thereby allowing for changes in the channel-to-channel phase separation, $\phi_P$, even in a system where the phase separation is initially unknown. As such, the need to pre-program the coefficients can be avoided.

Figure 15:
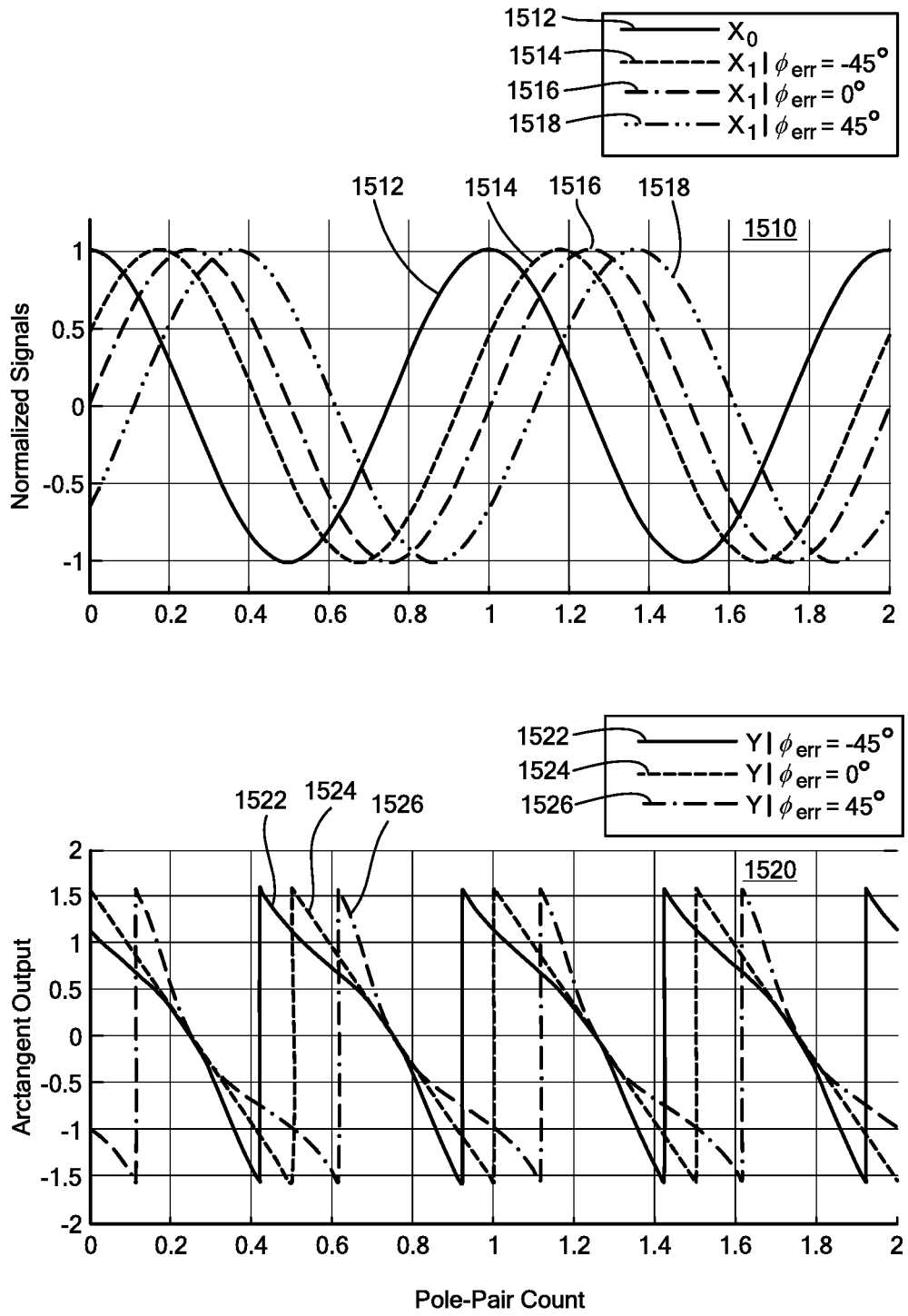
FIG. 15 shows example waveforms for the arctangent of various magnetic field signals at various phase errors, according to the disclosure.

The assumption in the Equations above is that the phase shift between the left and right real channels, $\phi_P$, is known and relatively stable. However, there may be some error, $\phi_{err}$, in the channel-to-channel phase separation, as shown in Equation 13:

$$\phi_P = \Phi_p + \phi_{err} \quad \text{Equation 13}$$

where $\Phi_p$ is the true (i.e., as-manufactured) channel-to-channel phase separation between the left and right channels, L and R, and $\phi_p$ is the applied phase separation. This is modeled for $|\Phi_p|=120°$, $\Phi_p$ lagging for various error values, as shown in FIG. 15, as described in greater detail below.

As will be appreciated, an angle signal can be generated from the first and second magnetic field signals by an angle generation unit (e.g., angle generation unit 48c in FIG. 1, 48c' in FIG. 1A, 149 in FIG. 1B, or 189 in FIG. 1C). The angle generation unit can be configured to generate an angle signal from the first and second magnetic field signals generated by the first and second magnetic field sensing elements (e.g., magnetic field signals 46a, 46b in FIG. 1 or 1A, 140a, 140b in FIG. 1B, or 178a, 78b in FIG. 1C). In some cases, the angle signal can be generated by calculating the arctangent of the magnetic field signals or by using a look-up table containing values to determine the corresponding angle of the object. The arctangent of a measured magnetic field signal divided by a virtual magnetic field signal (i.e., "virtual tangent") can be used to generate the angle signal.

Since a virtual channel can be generated at any arbitrary phase over a wide range provided that the specific target (and therefore its diameter and pole-pair count) is known, a virtual channel at an intended phase separation −90° from the reference channel, L or CH1, can be generated as described in Equations 8-12, and as outlined hereinabove regarding virtual channel signal generation techniques.

Removing the offset (zeroing) and normalizing Equations 5 and 7 from hereinabove yields Equations 14 and 15.

$$X_0 = \frac{L - O_L}{A_L} = \cos(2\pi f t)$$ Equation 14

$$X_1 = \frac{VC_1 - O_1}{A_1} = \sin(2\pi f t)$$ Equation 15

Equations 14 and 15 provide two possible quotients as illustrated in Equations 16 and 17.

$$\frac{X_0}{X_1} = \frac{\cos(2\pi f t)}{\sin(2\pi f t)} = \frac{1}{\tan(2\pi f t)}$$ Equation 16

$$\frac{X_1}{X_0} = \frac{\sin(2\pi f t)}{\cos(2\pi f t)} = \tan(2\pi f t)$$ Equation 17

Equations 16 and 17 are ultimately related as follows in Equations 18 and 19.

$$-\tan\left(\theta + \frac{\pi}{2}\right) = -\left(\frac{\sin\left(\theta + \frac{\pi}{2}\right)}{\cos\left(\theta + \frac{\pi}{2}\right)}\right) = -\left(\frac{\cos(\theta)}{-\sin(\theta)}\right) = \frac{1}{\tan(\theta)}$$ Equation 18

$$-\tan\left(\theta - \frac{\pi}{2}\right) = -\left(\frac{\sin\left(\theta - \frac{\pi}{2}\right)}{\cos\left(\theta - \frac{\pi}{2}\right)}\right) = -\left(\frac{-\cos(\theta)}{\sin(\theta)}\right) = \frac{1}{\tan(\theta)}$$ Equation 19

As will be appreciated, a simple sign change and phase shift of ±90° will translate the two. In either case, then, the division of the normalized and zeroed reference channel and virtual channel $$\left(\frac{X_0}{X_1}, \text{ or } \frac{X_1}{X_0}\right)$$

will yield what can be referred to as the "virtual tangent" of the target angle, which is given by Equations 16 and 17.

Having established the tangent of the target angle as described above, the target angle itself can be extracted by calculating (in real-time) the arctangent of the tangent of the target angle (e.g., using standard CORDIC or other processing to compute the arctangent of two magnetic field signals). This may be referred to herein as an "arctangent-virtual-tangent extraction" or more generally an "arctangent extraction" to refer to the arctangent calculation of the virtual tangent that is based on two measured magnetic field signals, at least one of which may be a virtual signal. Any of the techniques disclosed herein for virtual channel generation can be implemented to generate a virtual magnetic field signal. Consider the arctangent of Equations 16 and 17 as expressed by arctangent extractions in Equations 20 and 21.

$$\arctan\left(\frac{X_1}{X_0}\right) = \arctan(\tan(2\pi f t)) = 2\pi f t$$ Equation 20

$$\arctan\left(\frac{X_0}{X_1}\right) = \arctan\left(\frac{1}{\tan(2\pi f t)}\right) = -2\pi f t \mp \frac{\pi}{2}$$ Equation 21

The arctangent for various magnetic field signals, at various phase errors, is shown in FIG. 15. Graph 1510 shows the normalized signals as a function of the pole-pair count, with line 1512 being the real (or reference) magnetic field signal, line 1514 being a first virtual magnetic field signal at −45-degrees phase error, line 1516 being a second virtual magnetic field signal at 0-degrees phase error (i.e., at perfect quadrature with respect to signal 1512), and line 1518 being a third virtual magnetic field signal at 45-degrees of phase error.

Graph 1520 shows the arctangent calculation of the tangent of the reference magnetic field signal (1512) divided by each of the virtual magnetic field signals (1514, 1516, 1518). Specifically, line 1522 shows the arctangent extraction of the tangent of magnetic field signal 1512 divided by virtual magnetic field signal 1514, line 1524 shows the arctangent extraction of the tangent of magnetic field signal 1512 divided by virtual magnetic field signal 1516, and line 1526 shows the arctangent extraction of the tangent of magnetic field signal 1512 divided by virtual magnetic field signal 1518.

As shown in graph 1520, the arctangent extractions 1522, 1526 where phase error is present have inflection points (i.e., have points at which a change of slope occurs) rather than the straight (linear) slope of extraction 1524. This presence of one or more inflection points can be used in a feedback loop whereby the applied phase separation, $\phi_P$, between the two reference channels is adjusted to compensate for the phase error. The applied phase separation, $\phi_P$, refers to the phase separation between the two channels that provide the measured magnetic field signals. Refer, for example, to Equations 5-6 hereinabove showing the relationship between $\phi_P$, and the two channels (e.g., L and R channels). By observing the inflection of the arctangent extraction, determination and adjustment of the virtual channel coefficients ($a_i$, $b_i$) can be achieved.

Determining the presence of an inflection of the arctangent extraction is accomplished by taking the second derivative of the arctangent extraction, as shown in Equations 22 and 23:

$$Y' = \frac{d}{dt}Y = -2\pi f$$ Equation 22

$$Y'' = \frac{d}{dt}Y' = 0$$ Equation 23 where Y is from Equation 21.

The arctangent extraction should ideally be perfectly linear (i.e., have no inflection points) if the phase separation is as expected (i.e., if there is no phase error) as with the arctangent extraction 1524 shown in FIG. 15. Therefore, the first derivative of the arctangent should be constant (Equation 22) and the second derivative of the arctangent should be approximately zero (Equation 23) if there is no phase error. Thus, by determining where the second derivative is equal to approximately zero, the correct coefficient values can be determined (without phase error).

Figure 16:
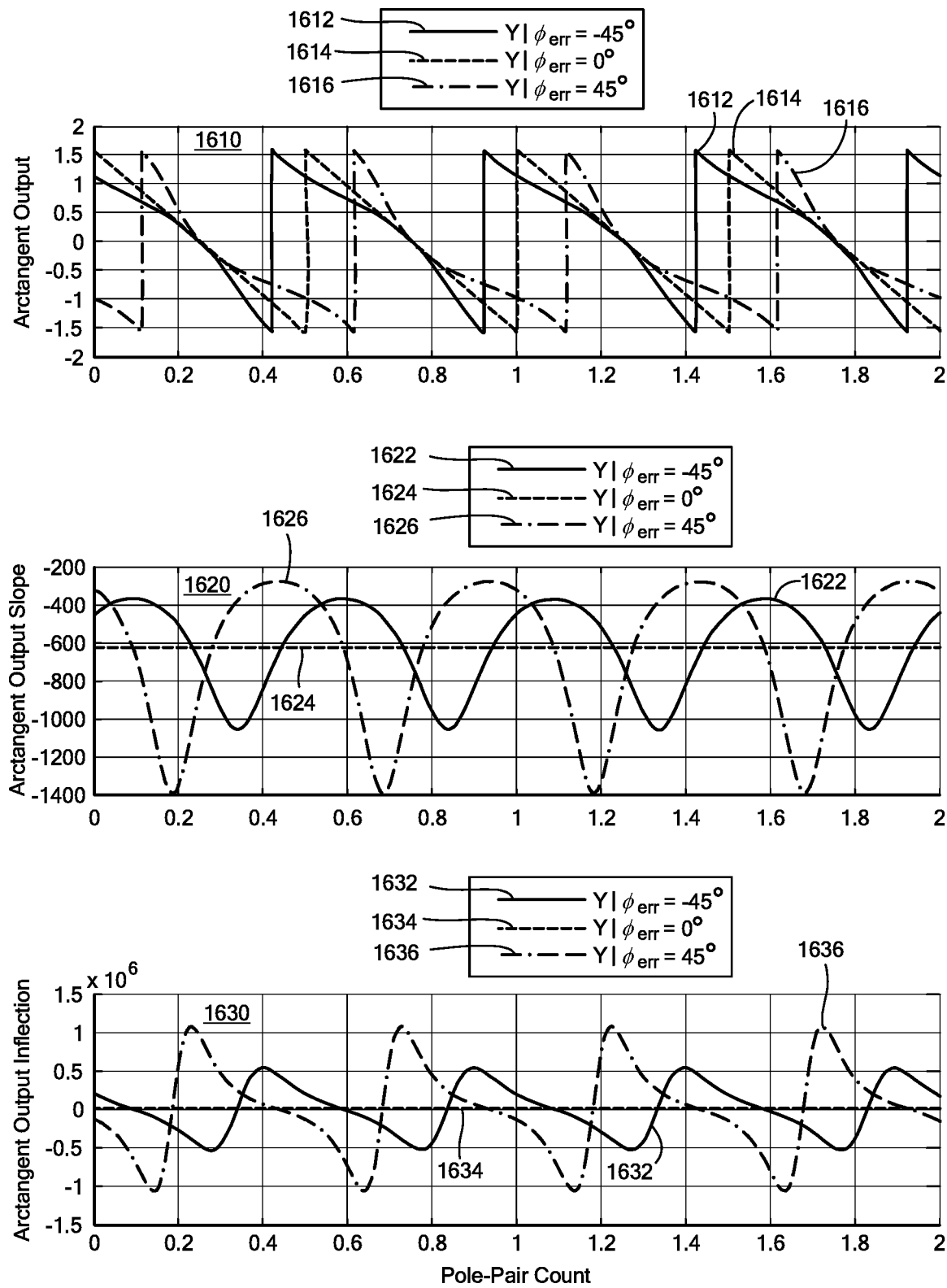
FIG. 16 shows example waveforms for arctangent extraction, the first derivative of the arctangent extraction, and the second derivative of the arctangent extraction, according to the disclosure.

The effects of the phase error are illustrated in FIG. 16. Graph 1610 shows the arctangent extraction as a function of pole-period count, graph 1620 shows the first derivative (i.e., slope) of the arctangent extraction of graph 1610, and graph 1630 shows the second derivative (i.e., inflection) of the arctangent extraction of graph 1610 for various errors in the phase separation.

The lines 1612, 1614, 1616 show three different arctangent extractions, lines 1622, 1624, 1626 show the first derivative of each of the arctangent extractions, respectively, and lines 1632, 1634, 1636 show the second derivative of each of the arctangent extractions, respectively, at −45- degrees, 0-degrees, and +45-degrees of phase error. Note in graph 1630 that there is no phase error when the second derivative of the arctangent extraction is equal to approximately zero as shown in line 1634.

It will be appreciated that, for the arctangent extractions of Equation 21, the zero-crossings of the zeroed and normalized input signal, $X_O$, is coincident with the zero-crossings of the virtual tangent and arctangent-tangent-extraction, regardless of the phase error. Thus, as illustrated in FIG. 16, if the inflection is evaluated in graph 1630 at the $X_O$ zero crossing, the result is very near the local peak of the inflection in the presence of phase error, and thus its sign can be established. Utilizing this information, the virtual channel coefficients can be adjusted, or calculated based upon an assumed phase difference. The coefficient adjustment or calculation drives the inflection error (via the second derivative of the arctangent extraction) to zero, thus achieving self-regulation.

Figure 17:
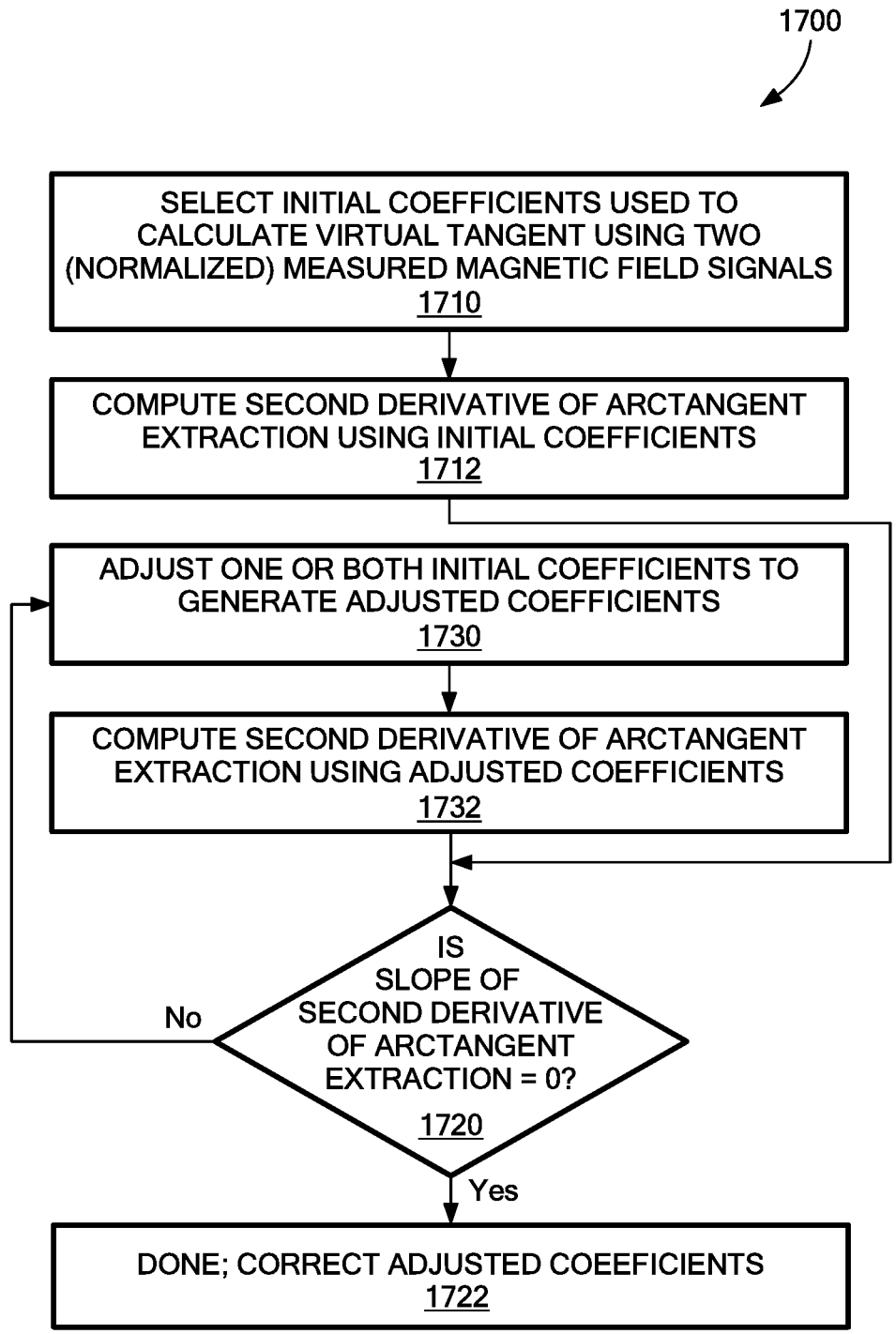
FIG. 17 is a flow diagram of a coefficient selection and adjustment technique (i.e., coefficient regulation), in accordance with the present disclosure.
Figure 18:
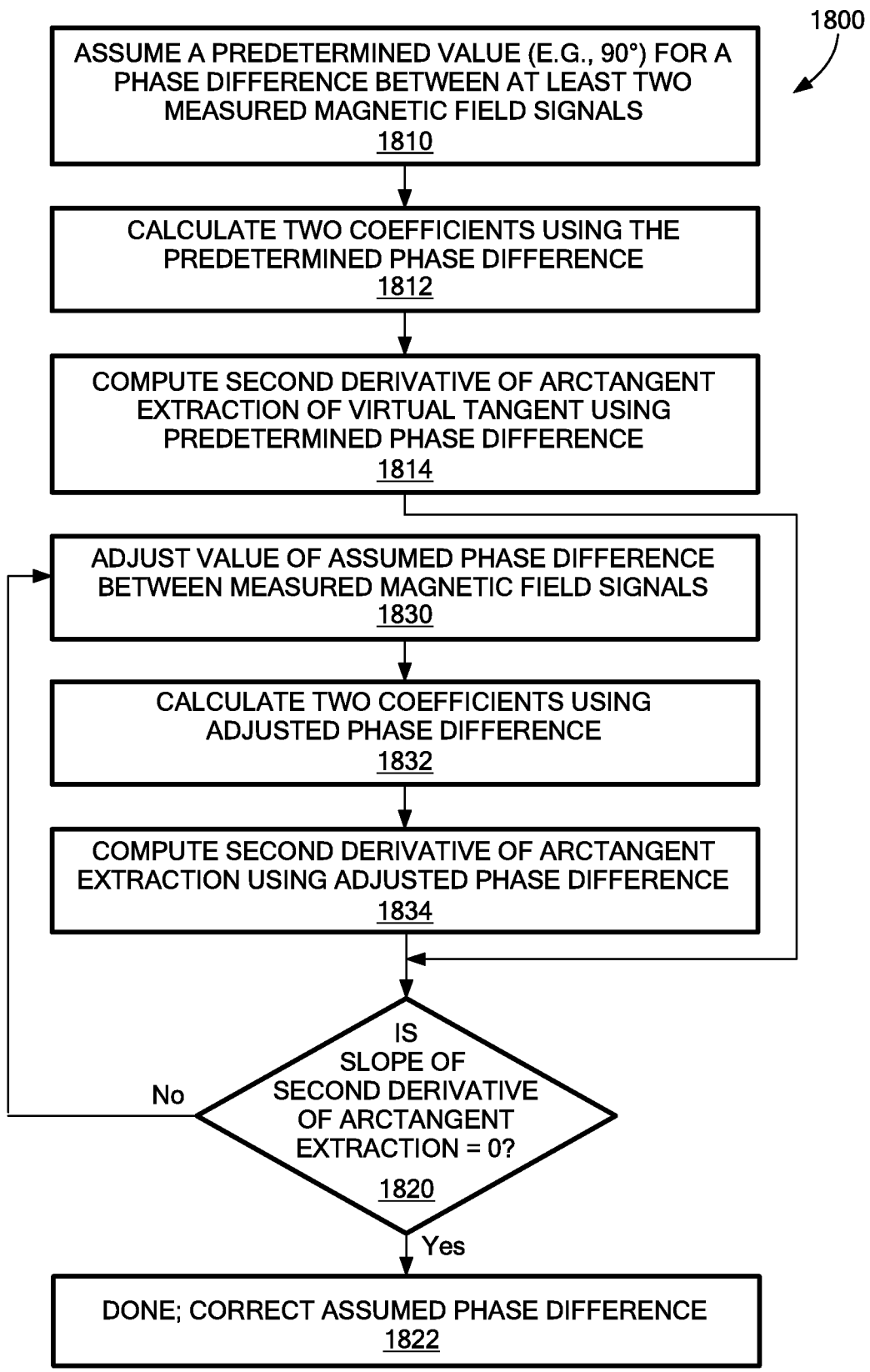
FIG. 18 is a flow diagram of a phase difference selection and adjustment and coefficient calculation (i.e., phase difference regulation), in accordance with the present disclosure.

There are at least two options for accounting for the channel-to-channel phase error, including a coefficient selection and adjustment (i.e., coefficient regulation) technique as shown in FIG. 17, and a phase difference selection and adjustment and coefficient calculation (i.e., phase difference regulation) technique as shown in FIG. 18, according to the present disclosure. According to either technique, the coefficients or assumed phase difference (and calculated coefficients) are adjusted until the slope of the second derivative of the arctangent extraction is equal to approximately zero. The second derivative of the arctangent extraction being equal to approximately zero indicates a phase error of zero and that the coefficients (or adjusted phase separation and coefficients calculated therefrom) are accurate to achieve the desired phase difference.

FIG. 17 is a flow diagram of a coefficient selection and adjustment (i.e., coefficient regulation) technique in accordance with the present disclosure. The sensor (e.g., any of sensors 10, 10', 100, or 170 in FIGS. 1-1C) can be configured to carry out the method 1700. According to this technique, initial values for the coefficients (e.g., coefficients $a_i$, $b_i$ in Equation 8) are selected, the virtual tangent is calculated, the arctangent extraction is calculated, and the slope of the second derivative of the arctangent extraction is evaluated to determine if it is equal to approximately zero. The coefficients are adjusted until the second derivative of the arctangent extraction is equal to approximately zero, indicating no or very low phase error.

At block 1710, initial coefficients are selected (e.g., coefficients $a_i$, $b_i$ in Equation 8) for use to calculate the virtual tangent using two (normalized) measured magnetic field signals. Refer, for example, to Equations 16-17 for calculating the virtual tangent using two normalized magnetic field signals.

At block 1712, the second derivative of the arctangent extraction is calculated using the initial coefficients selected at block 1710. Refer, for example, to Equation 23 hereinabove illustrating a second derivative of the arctangent extraction calculation. The method then continues to block 1720.

At block 1720, the slope of the second derivative of the arctangent extraction is evaluated to determine if it is equal to approximately zero. If the slope of the second derivative is equal to approximately zero at block 1720, then the method advances to block 1722 where the coefficients are determined to be accurate. However, if the slope of the second derivative is not equal to approximately zero at block 1720, the method returns to block 1730, and will continue to loop from block 1720 to blocks 1730 and 1732 until the slope of the second derivative is equal to approximately zero.

At block 1730, one or both of the initial coefficients selected in block 1710 are adjusted to generate adjusted coefficients. Various increments can be used to adjust the coefficients. The adjusted coefficients are used at block 1732 to compute the second derivative of the arctangent extraction. Refer, for example, to Equation 23 hereinabove for a second derivative of the arctangent extraction calculation. Then, using the adjusted coefficients, it is determined if the slope of the second derivative of the arctangent extraction is equal to approximately zero at block 1720. If the slope is equal to approximately zero with the adjusted coefficients, then the method advances to block 1722 with the accurate coefficients. However, if the slope is not equal to approximately zero, the method returns to block 1730, adjusts the coefficients again, and continues to adjust the coefficients, calculate the second derivative, and evaluate the slope to determine if the slope is equal to approximately zero, until the accurate coefficients are determined and the value is approximately zero.

Figure 19:
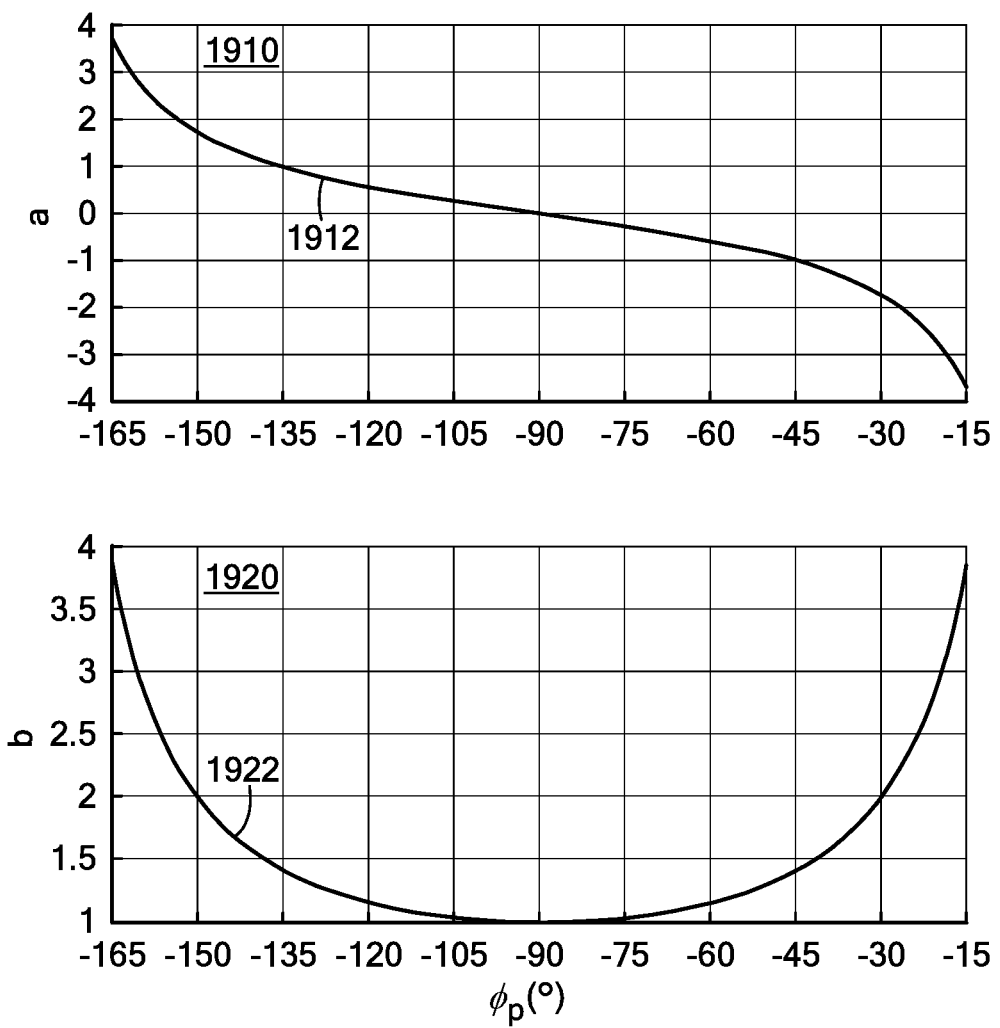
FIG. 19 shows example waveforms of the virtual coefficients as a function of various phase errors for a fixed phase separation between the reference channel and the virtual channel, in accordance with the present disclosure.

As shown in FIG. 19, the virtual channel coefficients can be any value in a finite range on the interval of −4 to 4 to satisfy a channel-to-channel phase shift range of 15° through 165° at an arbitrary desired phase shift between the two channels. Graph 1910 shows possible values for a first "a" coefficient (e.g., coefficient $a_i$ in Equation 8) and graph 1920 shows possible values for a second "b" coefficient (e.g., coefficient $b_i$ in Equation 8) that correspond to the value of graph 1910. FIG. 19 illustrates the range of the coefficients across various values of channel-to-channel phase difference for a desired phase separation $\phi_i$ between the reference channel and the virtual channel of 90°.

Another option to account for the channel-to-channel phase error, illustrated in FIG. 18, is to treat the applied phase separation $\phi_P$ between the two channels as the feedback variable itself. Adjusting the applied phase separation $\phi_P$ drives regulation of the virtual channel coefficients by direct calculation of the virtual channel coefficients based on the applied phase separation $\phi_P$. Once the second derivative of the arctangent extraction is approximately equal to zero, the correct phase separation, $\phi_P$, and thereby the correct coefficients (e.g., coefficients $a_i$, $b_i$) have been selected. Equations 9 and 10 hereinabove can be simplified which account for the zeroing and normalization, and the known desired phase shift of 90-degrees, as shown in Equations 24 and 25.

$$a_1 = \frac{1}{\tan(\phi_P)} = \frac{\cos(\phi_P)}{\sin(\phi_P)} = \cos(\phi_P)\left(\frac{1}{\sin(\phi_P)}\right) \quad \text{Equation 24}$$

$$b_1 = \frac{-1}{\sin(\phi_P)} = -1\left(\frac{1}{\sin(\phi_P)}\right) \quad \text{Equation 25}$$

As shown in Equations 24 and 25, the only values required to perform the calculations for the applied phase separation technique are $\sin(\phi_P)$ and $\cos(\phi_P)$. One option of the calculation of $\cos(\phi_P)$ is implementing a second order (k=2) recursive cosine half angle approximation as demonstrated in Equations 26 through 28:

$$c(\phi_P) = 1 - \frac{\phi_P^2}{2 \cdot 2^{2k}} = 1 - \frac{\phi_P^2}{32} \quad \text{Equation 26}$$

$$f(x) = 2 \cdot x^2 - 1 \quad \text{Equation 27}$$

$$\cos(\phi_P) \approx f(f(c)) \quad \text{Equation 28}$$

Likewise, this can be used to implement the calculation of $\sin(\phi_P)$, with Equations 29 and 30:

$$s = c\left(\phi_P - \frac{\pi}{2}\right) \quad \text{Equation 29}$$

$$\sin(\phi_P) \approx f(f(s)) \quad \text{Equation 30}$$

Thus, by adjusting the phase difference to drive regulation of the coefficients, the phase error can be eliminated.

FIG. 18 is a flow diagram of a phase difference selection and adjustment and coefficient calculation (i.e., phase difference regulation) technique according to the present disclosure. According to this technique, an assumed or otherwise predetermined value is selected as the phase separation, the coefficients are then calculated based upon this assumed phase separation, the virtual tangent is calculated, the arctangent extraction is calculated, and the second derivative of the arctangent extraction is calculated and evaluated. The correct phase separation assumption and resulting coefficients can be determined by the second derivative value being equal to approximately zero.

At block 1810, a predetermined value (for example, 90-degrees) is assumed for a phase difference, $\phi_P$, between two measured magnetic field signals. At block 1812, two coefficients are calculated using the predetermined phase difference. Refer, for example, to Equations 11 and 12 (or Equations 24 and 25) hereinabove for example equations used in calculating the coefficients. At block 1814, the second derivative of the arctangent extraction is computed using the predetermined phase difference. Refer, for example, to Equation 23 for an example equation of the second derivative of the arctangent and to Equations 20 and 21 for example equations of the arctangent extraction. Then, at block 1820, it is determined if the slope of the second derivative of the arctangent is equal to approximately zero. If the slope is equal to approximately zero, then the method is done and at block 1822, and the assumed phase difference is determined to be the actual phase difference. However, if the slope of the arctangent extraction is not equal to approximately zero, the method advances to block 1830 to adjust the value of the assumed phase difference, $\phi_P$, between the measured magnetic field signals. Various increments can be used to adjust the assumed phase difference (e.g., 1° increments).

At block 1830, the value of the assumed phase difference is adjusted. Then at block 1832, the two coefficients are re-calculated using the adjusted phase difference. The calculated coefficients are then used to compute a second derivative of the arctangent extraction using the adjusted phase difference at block 1834. The method then determines at block 1820 if the slope of the second derivative is equal to approximately zero. If the slope is not equal to zero, the method will return to blocks 1830 through 1834 until the slope is equal to approximately zero at block 1820. If the slope is equal to approximately zero with the adjusted phase difference, the method is done and at block 1822, the adjusted phase difference is determined to be the actual phase difference, and the calculated coefficients are likewise correct.

Figure 20:
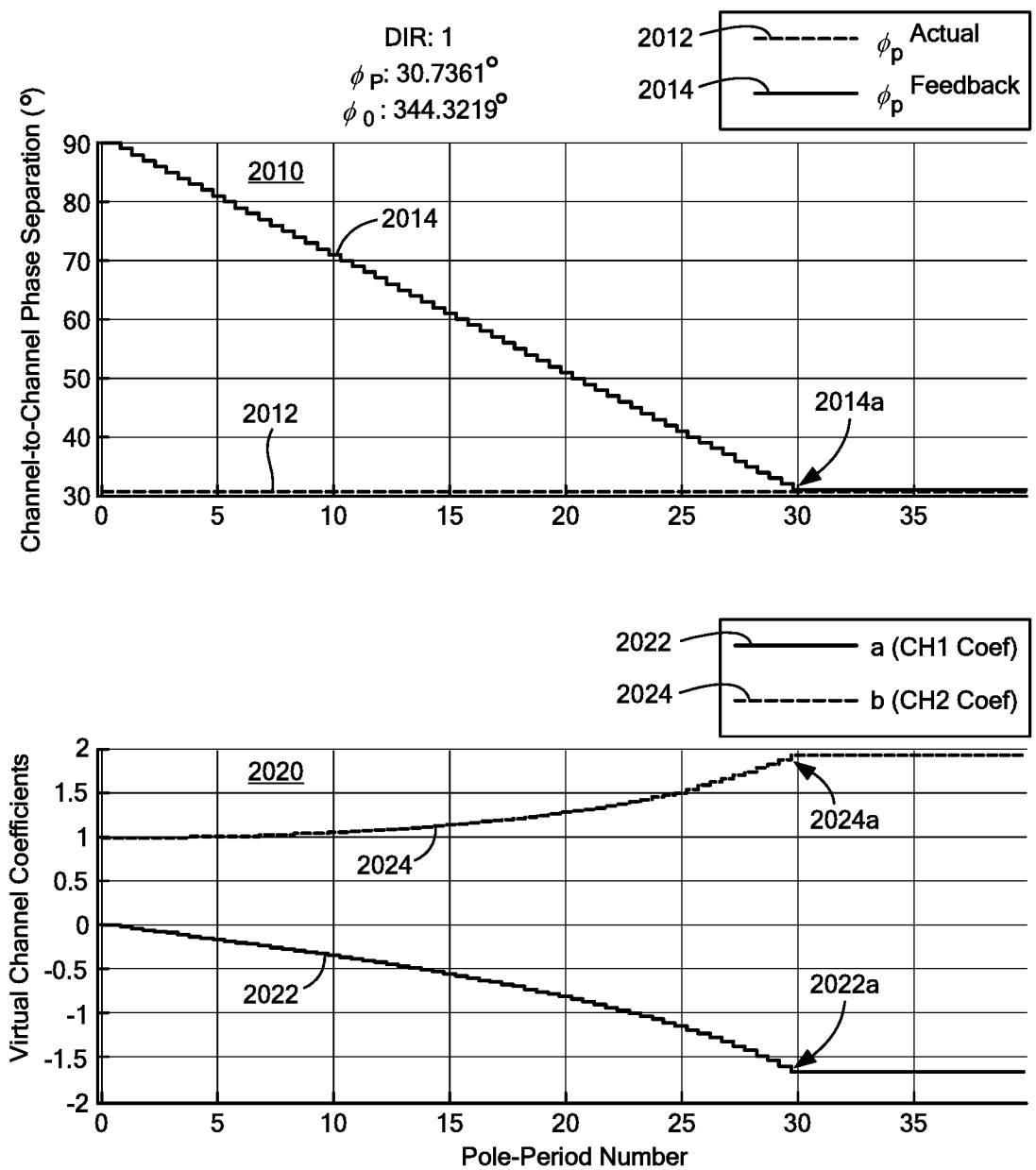
FIG. 20 shows example waveforms associated with the channel-to-channel phase difference regulation technique of the present disclosure.

Example waveforms associated with the channel-to-channel phase separation regulation are illustrated in FIG. 20. Graph 2010 illustrates example implementation channel-to-channel phase separation selection. As shown in graph 2010, the actual phase separation 2012 is approximately 30° and the feedback phase separation 2014 is assumed to be 90° at the initial pole-period number (i.e., pole period number 0). The feedback phase separation 2014 is adjusted downward (step 1830 of FIG. 18), as shown, continuously until at point 2014a (at approximately pole-period 30), the second derivative of the arctangent extraction is approximately equal to zero, at which time the feedback phase separation 2014 matches the actual phase separation 2012.

Graph 2020 illustrates the calculated virtual channel coefficients corresponding to the feedback phase separation of graph 2010 (step 1832 of FIG. 18). As shown, the computed values of the first coefficient 2022 and second coefficient 2024 vary with the feedback phase separation 2014 until points 2022a, 2024a, when the second derivative of the arctangent extraction of the virtual tangent is equal to approximately zero.

Figure 21:
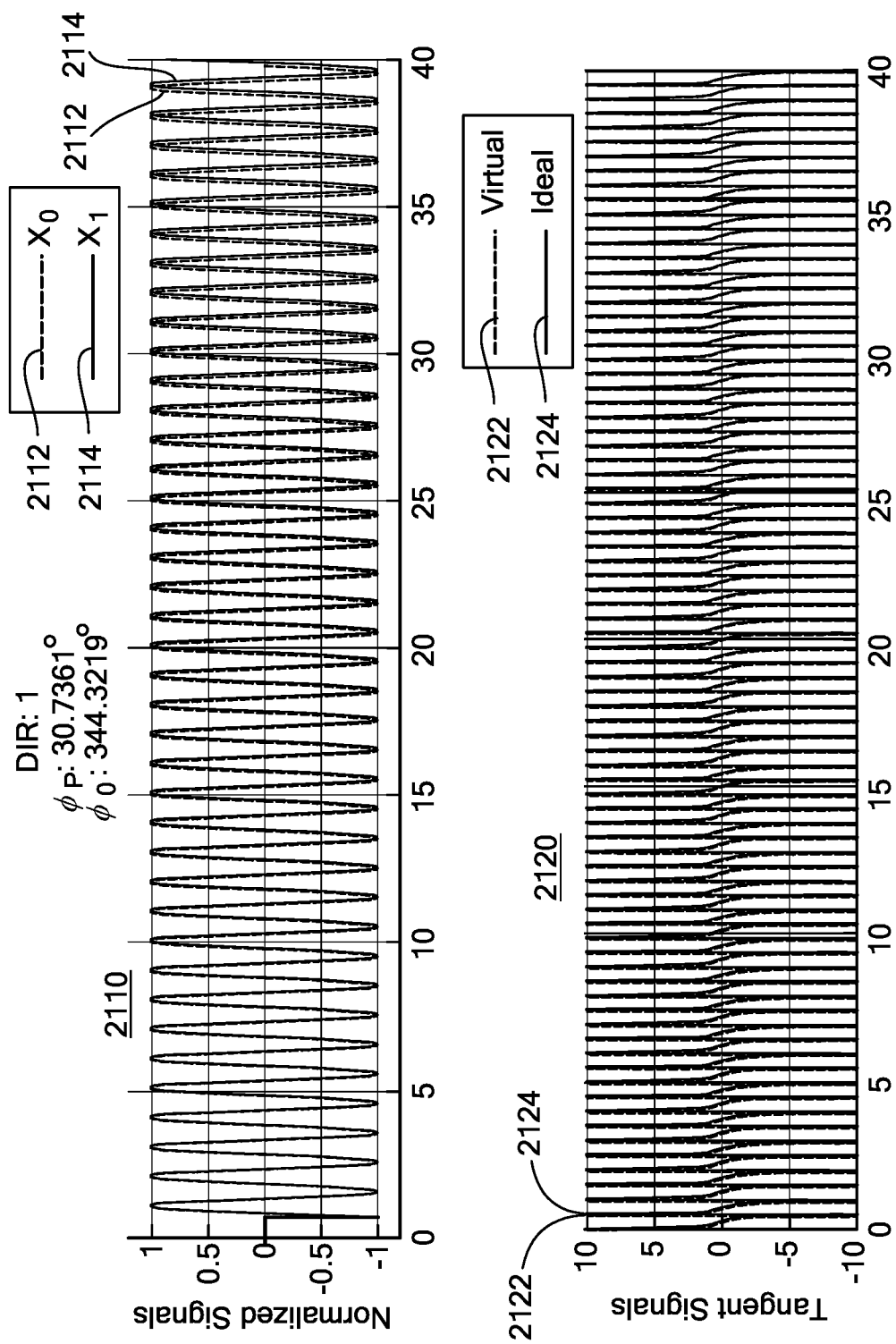
FIG. 21 shows example waveforms including normalized magnetic field signals, corresponding tangent signals, and corresponding arctangent extraction signals, according to the present disclosure.
Figure 21:
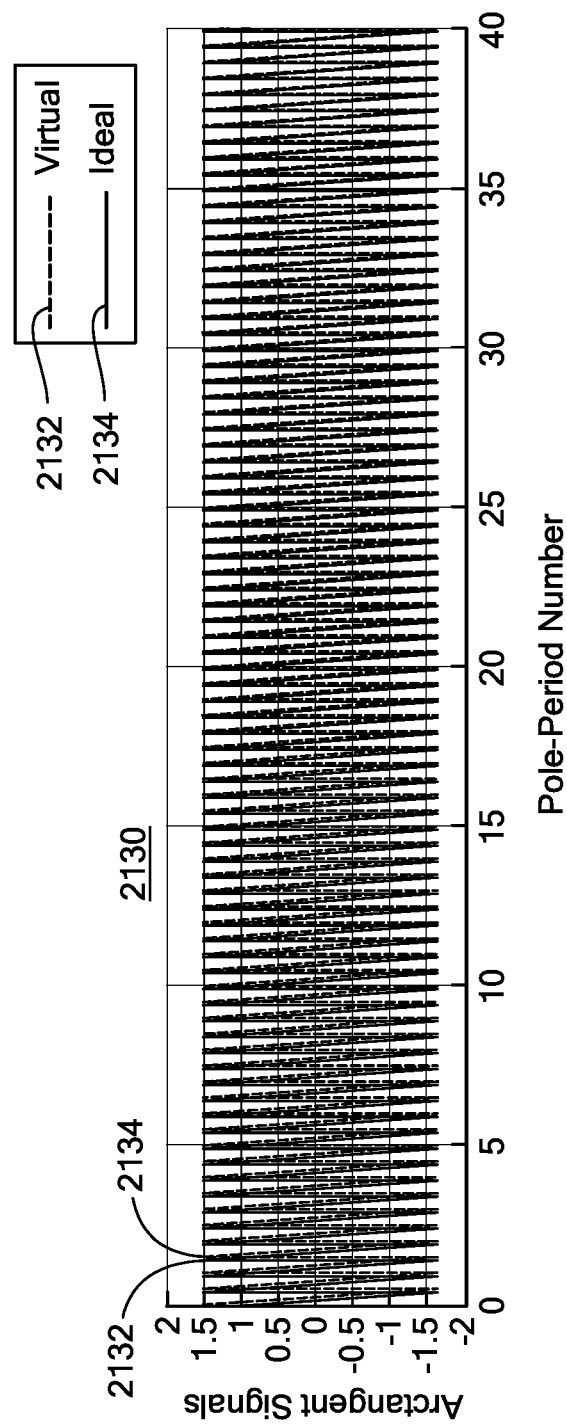

FIG. 21 shows normalized input signals at graph 2110, ideal and realized tangent signals at graph 2120 (i.e., the virtual tangent), and arctangent signals at graph 2130 (i.e., the arctangent extraction). Normalized input signal 2112 ($X_0$) is the normalized, zero-meaned replica of the reference real input channel and normalized input signal 2114 ($X_1$) is the normalized, zero-meaned virtual channel which is 90 degrees phase-shifted from the reference channel. The graph 2120 shows the virtual tangent of a virtual signal and at least one measured magnetic field signal. Virtual tangent signal 2122 is the virtual divided by the real to arrive at the calculated tangent value. Ideal tangent signal 2124 is the ideal tangent value (i.e., the tangent value with no phase error). Graph 2130 shows the arctangent of the virtual tangent (i.e., the arctangent extraction). Signal 2132 is the arctangent of the virtual tangent 2122, and 2134 is the arctangent of the ideal tangent 2124. At the start (pole-period number 0), the arctangent extraction 2132 is not a perfect sawtooth. As the arctangent extraction approaches approximately pole-period 30, waveform 2132 becomes almost a perfect sawtooth shape, because of the now true phase separation (i.e., there is no phase error).

It will be appreciated that the feedback loop described above in connection with the methods of FIGS. 17 and 18 can continue to update and calculate the phase separation and/or coefficients simultaneously as the magnetic field signals are being generated by the sensor. Alternatively, the feedback loop can be implemented outside of the main signal path in which case a redundant arctangent extraction can be implemented on which adjustments are made until convergence is reached. Once settled, the point at which the adjusted virtual channel and its main signal path counterpart intersect could be used to update the main signal path virtual channel coefficients.

Figure 22:
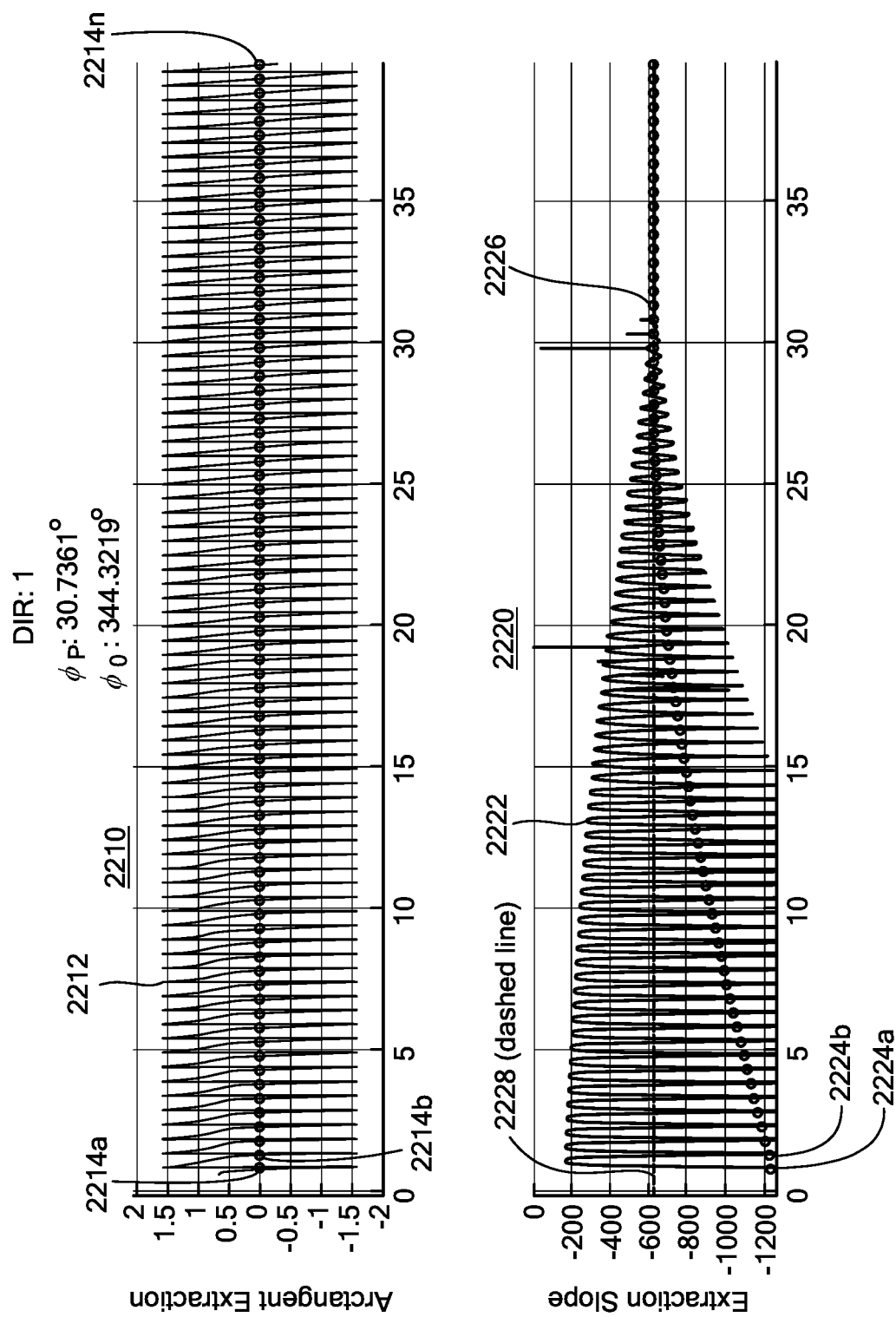
FIG. 22 shows example waveforms including the arctangent extraction signals, the first derivative of the arctangent extraction signals, and the second derivative of the arctangent extraction signals, according to the present disclosure.
Figure 22:
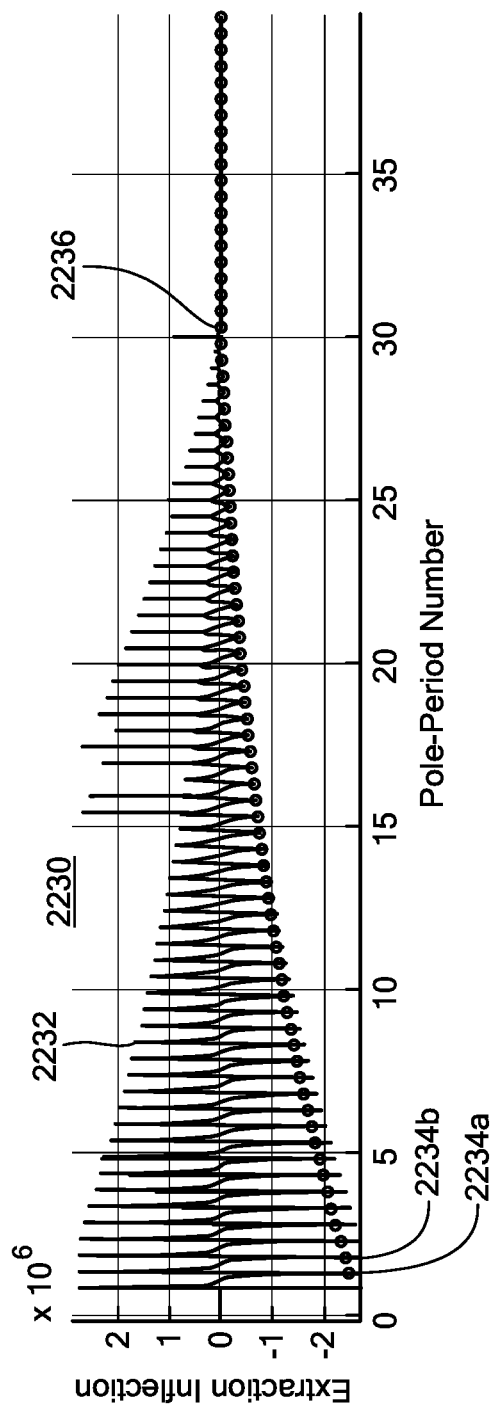

FIG. 22 shows the arctangent extraction 2212 in graph 2210, the first derivative 2222 of the arctangent extraction at graph 2220, and the second derivative 2232 of the arctangent extraction at graph 2230. The second derivative of the arctangent extraction is evaluated each time the input signal crosses zero. As will be appreciated in light of the present disclosure, the coefficient values (whether regulated according to FIG. 17 or calculated using the regulated phase separation according to FIG. 18) are correct when the second derivative is equal to approximately zero. The arctangent extraction 2210 is sampled at zero-crossings (circles 2214a, 2214b, . . . 2214n). The first derivative of the arctangent 2222 is sampled at zero-crossings of arctangent extraction (circles 2224a, 2224b), and through until point 2226 when it is determined that the second derivative of the arctangent extraction is zero. The second derivative of the arctangent 2232 is sampled at zero-crossings of the arctangent extraction (circles 2234a, 2234b) and through until 2236 where it is determined that the second derivative of the arctangent extraction is zero. Thus, as shown in graph 2230, the coefficient values are correct when the second derivative 2230 reaches sample 2236 at approximately pole-period number 30, where the value is approximately zero.

Note that in FIG. 22, the circles indicate the input signal zero-crossings where the $\phi_P$ adjustments are made. The zero crossing of Y corresponds to a near peak in Y''' when phase error is present. Equation 21 is selected (rather than Equation 20) so that the zero crossings of $X_0$ are coincident with the zero crossings of Y. Further, in the graph 2220, line 2228 is at $-d \cdot 2\pi f$, where d is 1 for forward rotation and −1 for reverse rotation. Graph 2220 illustrates convergence to the correct value for the first derivative.

All references cited herein are hereby incorporated herein by reference in their entirety. Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
a plurality of magnetic field sensing elements configured to generate at least two measured magnetic field signals indicative of a magnetic field affected by an object and having a first phase difference $\phi_p$ with respect to each other; and
a controller responsive to the at least two measured magnetic field signals and configured to generate at least one virtual magnetic field signal having a second predetermined phase difference $\phi_i$ with respect to at least one of the measured magnetic field signals;
wherein the at least one virtual magnetic field signal is generated according to a mathematical function based on a first coefficient corresponding to a first channel, the first coefficient based on the first phase difference and the second predetermined phase difference, and a second coefficient corresponding to a second channel, the second coefficient based on the first phase difference and the second predetermined phase difference.

2. The magnetic field sensor of claim 1, wherein the controller is further configured to:
calculate a virtual tangent comprising a tangent of the virtual magnetic field signal and at least one of the measured magnetic field signals;
calculate an arctangent extraction comprising an arctangent of the virtual tangent; and
calculate a second derivative of the arctangent extraction.

3. The magnetic field sensor of claim 2, wherein the controller is further configured to:
select initial values for the first and second coefficients used to calculate the virtual tangent; and
determine if a slope of the second derivative of the arctangent extraction is equal to approximately zero.

4. The magnetic field sensor of claim 3, wherein the controller is configured to adjust one or both of the initial values for the first and second coefficients until the second derivative of the arctangent extraction is equal to approximately zero.

5. The magnetic field sensor of claim 2, wherein the controller is further configured to:
assume an initial predetermined value for the first phase difference;
calculate the first and second coefficients; and
determine if a slope of the second derivative of the arctangent extraction is equal to approximately zero.

6. The magnetic field sensor of claim 5, wherein when the slope of the second derivative is not equal to zero, the controller is configured to:
adjust the initial predetermined value for the first phase difference to provide an adjusted first phase difference;
calculate the second derivative of the arctangent extraction using the adjusted first phase difference; and
determine if the slope of the second derivative of the arctangent extraction is equal to approximately zero.

7. The magnetic field sensor of claim 6, wherein the adjusted first phase difference is indicative of the second predetermined phase difference when the slope of the second derivative of the arctangent extraction is equal to approximately zero.

8. The magnetic field sensor of claim 1, wherein the second predetermined phase difference is 90-degrees.

9. A method comprising:
generating at least two measured magnetic field signals indicative of a magnetic field affected by an object, wherein the at least two measured magnetic field signals have a first phase difference $\phi_p$ with respect to each other; and
processing the at least two measured magnetic field signals to generate at least one first virtual magnetic field signal having a second predetermined phase difference (Pi with respect to at least one of the at least two measured magnetic field signals;
wherein the at least one virtual magnetic field signal is generated according to a mathematical function based on a first coefficient corresponding to a first channel, the first coefficient based on the first phase difference and the second phase difference, and a second coefficient corresponding to a second channel, the second coefficient based on the first phase difference and the second predetermined phase difference.

10. The method of claim 9, further comprising:
calculating a second derivative of an arctangent extraction of a virtual tangent of the virtual magnetic field signal and at least one of the magnetic field signals.

11. The method of claim 10, wherein computing the second derivative comprises:
selecting initial coefficients used to calculate the virtual tangent;
calculating the second derivative using the initial coefficients; and
determining if a slope of the second derivative is equal to zero.

12. The method of claim 11, wherein when the slope of the second derivative is not zero, further comprising:
adjusting at least one of the initial coefficients to generate adjusted coefficients;
calculating the second derivative of the arctangent extraction using the adjusted coefficients; and
determining if the slope of the second derivative is equal to zero, wherein the adjusted coefficients are correct when the slope of the second derivative is equal to zero.

13. The method of claim 10, wherein computing the second derivative comprises:
assuming an initial predetermined value for the first phase difference between the at least two measured magnetic field signals;
calculating the coefficients using the initial predetermined value; and
calculating the second derivative of an arctangent extraction of the virtual tangent using the initial predetermined value for the phase difference.

14. The method of claim 13, further comprising:
determining if a slope of the second derivative is equal to zero; and
when the slope of the second derivative is not equal to zero:
adjusting the value for the first phase difference to an adjusted phase value;
calculating the coefficients; and
computing the second derivative using the adjusted phase value.

15. The method of claim 14 further comprising:
determining if the slope of the second derivative is equal to zero, wherein the adjusted phase value is correct when the slope of the second derivative is equal to zero.

16. An apparatus comprising:
means for generating at least two measured magnetic field signals indicative of a magnetic field affected by an object, wherein the at least two measured magnetic field signals have a first phase difference with respect to each other; and
means for processing the at least two measured magnetic field signals to generate at least one first virtual magnetic field signal having a second predetermined phase difference with respect to at least one of the at least two measured magnetic field signals;
wherein the at least one virtual magnetic field signal is generated according to a mathematical function based on a first coefficient corresponding to a first channel, the first coefficient based on the first phase difference and the second phase difference, and a second coefficient corresponding to a second channel, the second coefficient based on the first phase difference and the second predetermined phase difference.

17. The apparatus of claim 16, further comprising:
means for computing a second derivative of an arctangent extraction of a virtual tangent of the virtual magnetic field signal and at least one of the magnetic field signals.

18. The apparatus of claim 17, wherein the means for computing the second derivative comprises:
means for selecting initial coefficients used to calculate the virtual tangent;
means for calculating the second derivative using the initial coefficients; and
means for determining if a slope of the second derivative is equal to zero.

19. The apparatus of claim 17, wherein the means for computing the second derivative comprises:
means for assuming an initial predetermined value for the first phase difference between the at least two measured magnetic field signals;
means for calculating the coefficients using the initial predetermined value; and
means for computing the second derivative of an arctangent extraction of the virtual tangent using the initial predetermined value for the phase difference.

20. The apparatus of claim 19, further comprising, when the slope of the second derivative is not equal to zero:
means for adjusting the value for the first phase difference to an adjusted phase value;
means for calculating the coefficients; and
means for calculating the second derivative using the adjusted phase value.

* * * * *

UNITED STATES PATENT AND TRADEMARK OFFICE
CERTIFICATE OF CORRECTION

PATENT NO. : 10,908,229 B2
APPLICATION NO. : 16/686419
DATED : February 2, 2021
INVENTOR(S) : Richards Page 1 of 1

It is certified that error appears in the above-identified patent and that said Letters Patent is hereby corrected as shown below:

In the Specification

Column 18, Line 31 delete "show" and replace with --shown--.

Column 21, Line 53 delete "the at" and replace with --the--.

Column 22, Lines 51-52 delete "in order improve" and replace with --in order to improve--.

Column 24, Line 22 delete "channel)." and replace with --channel.--.

Column 24, Line 57 delete "coefficient" and replace with --coefficients--.

Column 24, Line 64-65 delete "shifted phase signal virtual signals," and replace with --phase shifted virtual signals,--.

Column 25, Line 29 delete "and can be" and replace with --can be--.

Column 26, Line 51 delete ", 78b in" and replace with --, 178b in--.

Column 31, Line 48 delete "and at" and replace with --at--.

In the Claims

Column 34, Line 37 delete "(Pi" and replace with --$\phi i$--.

Signed and Sealed this
Twenty-second Day of February, 2022

Drew Hirshfeld
*Performing the Functions and Duties of the
Under Secretary of Commerce for Intellectual Property and
Director of the United States Patent and Trademark Office*